US011280645B2

(12) United States Patent
Croke et al.

(10) Patent No.: US 11,280,645 B2
(45) Date of Patent: Mar. 22, 2022

(54) MEASUREMENT SYSTEM

(71) Applicant: Analog Devices International Unlimited Company, Limerick (IE)

(72) Inventors: Claire Croke, Aherla (IE); Aine McCarthy, Carrigaline (IE); Adrian Sherry, Raheen (IE); Giovanni C. Dotta, Limerick (IE); Dan O'Donovan, Limerick (IE); Sean Wilson, Limerick (IE); Mary McCarthy, Innishannon (IE); Colin G. Lyden, Baltimore (IE); Fiona Treacy, Limerick (IE); Michael Byrne, Limerick (IE)

(73) Assignee: Analog Devices International Unlimited Company, Limerick (IE)

( * ) Notice: Subject to any disclaimer, the term of this patent is extended or adjusted under 35 U.S.C. 154(b) by 252 days.

(21) Appl. No.: 16/262,676

(22) Filed: Jan. 30, 2019

(65) Prior Publication Data

US 2019/0242730 A1 Aug. 8, 2019

Related U.S. Application Data

(60) Provisional application No. 62/625,747, filed on Feb. 2, 2018.

(51) Int. Cl.
*G01D 18/00* (2006.01)
*H03M 1/00* (2006.01)
*G01D 21/00* (2006.01)

(52) U.S. Cl.
CPC ........... *G01D 18/00* (2013.01); *G01D 18/002* (2013.01); *G01D 21/00* (2013.01); *H03M 1/00* (2013.01)

(58) Field of Classification Search
CPC ...... G01D 18/00; G01D 18/002; G01D 21/00; H03M 1/00

(Continued)

(56) References Cited

U.S. PATENT DOCUMENTS 4,311,965 A 1/1982 Jones
5,170,333 A 12/1992 Niwayama
(Continued)

FOREIGN PATENT DOCUMENTS

CN 1623131 A 6/2005
CN 102914975 A 2/2013
(Continued)

OTHER PUBLICATIONS

Grady ( "Transducer/sensor excitation and measurement techniques", Analogue Dialogue vol. 34, No. 5, 2000) (Year: 2000).*
(Continued)

*Primary Examiner* — Catherine T. Rastovski
*Assistant Examiner* — Aeysha N Sultana
(74) *Attorney, Agent, or Firm* — Schwegman Lundberg & Woessner, P.A.

(57) ABSTRACT

Various examples are directed to methods and system of managing a sensor. A measurement system may receive from the host device, a first register map describing a first configuration of the measurement system for the first sensor. The first configuration may indicate a first measurement frequency for the first sensor. The measurement system may configure a switch matrix to provide a first excitation signal to the first sensor. The measurement system may configure the switch matrix to connect an analog-to-digital converter (ADC) of the measurement system to the first sensor. The measurement system may sample a first raw sensor signal from the first sensor with the ADC at a first measurement frequency described by the first configuration. The measurement system may generate first digital measurement data based at least in part on the first raw sensor signal and send the first digital measurement data to the host device.

18 Claims, 12 Drawing Sheets

(58) Field of Classification Search
USPC .......................................................... 702/188
See application file for complete search history.

(56) References Cited

U.S. PATENT DOCUMENTS

| | | | |
|---|---|---|---|
| 5,226,125 | A | 7/1993 | Balmer et al. |
| 5,613,146 | A | 3/1997 | Gove et al. |
| 6,275,864 | B1 | 8/2001 | Mancusi et al. |
| 6,448,914 | B1 | 9/2002 | Younis et al. |
| 6,532,436 | B2 | 3/2003 | Motz |
| 6,823,283 | B2 | 11/2004 | Steger et al. |
| 6,944,176 | B1 | 9/2005 | Brown et al. |
| 7,024,660 | B2 | 4/2006 | Andrade et al. |
| 7,382,790 | B2 | 6/2008 | Warren et al. |
| 7,535,254 | B1 | 5/2009 | Case |
| 7,599,299 | B2 | 10/2009 | Goetting et al. |
| 7,626,272 | B2 | 12/2009 | Kemerling et al. |
| 7,890,079 | B2 | 2/2011 | Behzad et al. |
| 7,903,008 | B2 | 3/2011 | Regier |
| 8,041,314 | B2 | 10/2011 | Vilhonen |
| 8,044,716 | B1 | 10/2011 | Loeb et al. |
| 8,054,208 | B2 | 11/2011 | Fletcher et al. |
| 8,373,586 | B2 | 2/2013 | Alley et al. |
| 8,744,418 | B2 | 6/2014 | Novet |
| 8,843,338 | B2 * | 9/2014 | Laaksonen ............. G01C 17/38 702/93 |
| 8,878,570 | B2 | 11/2014 | Thomsen |
| 9,817,537 | B1 | 11/2017 | Shakya et al. |
| 10,303,736 | B2 * | 5/2019 | Brett ..................... G06F 17/142 |
| 2004/0036671 | A1 | 2/2004 | Hudson |
| 2004/0266480 | A1 | 12/2004 | Hjelt et al. |
| 2006/0129347 | A1 | 6/2006 | Gadh et al. |
| 2009/0276486 | A1 | 11/2009 | Tandon et al. |
| 2011/0153786 | A1 | 6/2011 | Merkel et al. |
| 2013/0285739 | A1 | 10/2013 | Blaquiere et al. |
| 2014/0043251 | A1 | 2/2014 | Wilson et al. |
| 2014/0293663 | A1 | 10/2014 | Ledezma et al. |
| 2016/0169717 | A1 * | 6/2016 | Zhitomirsky ............ G01D 5/20 702/94 |
| 2017/0241804 | A1 * | 8/2017 | Lyden .................... G01D 18/00 |
| 2019/0242729 | A1 | 8/2019 | Croke et al. |

FOREIGN PATENT DOCUMENTS

| | | | | |
|---|---|---|---|---|
| CN | 103105181 | A | 5/2013 | |
| CN | 104539502 | A | 4/2015 | |
| CN | 105027174 | A | 11/2015 | |
| CN | 105843366 | A | 8/2016 | |
| CN | 106796506 | A | 5/2017 | |
| DE | 10201885 | A1 | 7/2003 | |
| EP | 2815221 | B1 * | 5/2016 | .......... G01M 5/0033 |
| JP | H044863 | A | 1/1992 | |
| JP | H0564730 | U | 8/1993 | |
| JP | 2004061251 | A | 2/2004 | |
| JP | 2007109185 | A | 4/2007 | |
| JP | 2016126665 | A | 7/2016 | |
| JP | 2019507455 | A | 3/2019 | |
| KR | 20170074476 | A | * 6/2017 | |
| WO | WO-0122037 | A1 | 3/2001 | |

OTHER PUBLICATIONS

"CC1310 SimpleLink Ultra-Low-Power Sub-1 GHz Wireless MCU", Texas Instruments, (Sep. 2015), 59 pgs.
"CC1350 SimpleLink Ultra-Low-Power Dual-Band Wireless MCU", Texas Instruments, (Jun. 2016), 64 pgs.
"CC3200 SimpleLink Wi-Fi and Internet-of-Things Solution, a Single-Chip Wireless MCU", Texas Instruments, (Jul. 2013), 71 pgs.
"Cross Domain Development Kit XDK", Bosch Connected Devices and Solutions datasheet, (accessed Jan. 30, 2018), 2 pgs.
"Programmable Controller for Capacitance Touch Sensors", Analog Devices Data Sheet AD7142, (2006), 70 pgs.
"AnadigmApex dsASP Family User Manual", Anadigm, Inc. AN13x series, AN23x series, (2006), 36 pgs.
"Chinese Application Serial No. 201910109893.6, Office Action dated Nov. 19, 2020", w/o English Translation, 12 pgs.
"Chinese Application Serial No. 201910109893.6, Response filed Mar. 11, 2021 to Office Action dated Nov. 19, 2020", w/ English claims, 16 pgs.
"Datasheet—Keysight Technologies M9295B PXIe Digital Stimulus/Response with PPME: 250 MHz, 16-channel", Keysight Technologies, (2016), 21 pgs.
"Japanese Application Serial No. 2019-017986, Notification of Reasons for Refusal dated Aug. 17, 2020", w/ English translation, 18 pgs.
"Japanese Application Serial No. 2019-017986, Response filed Dec. 14, 2020 to Notification of Reasons for Refusal dated Aug. 17, 2020", w/ English claims, 11 pgs.
"Parametric Measurement Unit and Supporting Components for ATE ApplicationsUsing the AD5522 PMU and the AD7685 16-Bit ADC", Analog Devices, Inc. Circuit Note, CN-0104, (2009), 4 pqs.
"Programmable IC delivers analog design", ApenCore, Inc., [Online]. Retrieved from the Internet on Jun. 23, 2016: <URL: http://www.electronicproducts.com/Analog_Mixed_Signal_ICs/Programmable_IC_delivers_analog_design.aspx>, (2016), 3 pgs.
Hassan, Mohammed F., "Field Programmable Analog Arrays: A Brief History", VLSI Egypt, [Online] Retrieved from the Internet on Jun. 23, 2016: <URL: http://www.vlsiegypt.com/home/?p=1125>, (2016), 6 pgs.
Pankiewicz, Bogdan, et al., "A Field Programmable Analog Array for CMOS Continuous-Time OTA-C Filter Applications", IEEE Journal of Solid-State Circuits, 37(2), (Feb. 2002), 125-136.
"U.S. Appl. No. 16/262,579, Corrected Notice of Allowability dated May 7, 2021", 2 pgs.
"U.S. Appl. No. 16/262,579, Notice of Allowance dated Apr. 15, 2021", 12 pgs.
"U.S. Appl. No. 16/262,579, Notice of Allowance dated Jul. 29, 2021", 11 pgs.
"U.S. Appl. No. 16/262,579, PTO Response to Rule 312 Communication dated Jul. 6, 2021", 2 pgs.
"Chinese Application Serial No. 201910109893.6, Decision of Rejection dated Jul. 13, 2021", w/ English Machine Translation, 28 pgs.
"Chinese Application Serial No. 201910109893.6, Office Action dated Apr. 9, 2021", w/ English Translation, 14 pgs.
"Chinese Application Serial No. 201910109893.6, Response filed May 18, 2021 to Office Action dated Apr. 9, 2021", w/ English claims, 18 pgs.
"European Application Serial No. 19154887.4, Invitation pursuant to Article 94(3) and Rule 71(1) EPC dated Jun. 11, 2021", 5 pgs.
"Japanese Application Serial No. 2019-017986, Notification of Reasons for Refusal dated Jun. 7, 2021", w/ English translation, 7 pgs.
"Japanese Application Serial No. 2019-017986, Response filed Sep. 6, 2021 to Notification of Reasons for Refusal dated Jun. 7, 2021", w/ English Claims, 12 pgs.
"Chinese Application Serial No. 201910109893.6, Response filed Oct. 12, 2021 to Decision of Rejection dated Jul. 13, 2021", w/ English Claims, 17 pgs.

* cited by examiner

SENSOR DETAILS REGISTER

| 31 | 30 | 29 | 28 | 27 | 26 | 25 | 24 | 23 | 22 | 21 | 20 | 19 | 18 | 17 | 16 |
|---|---|---|---|---|---|---|---|---|---|---|---|---|---|---|---|
| NU | AVERAGING | | | NU | PGA GAIN | | | REFERENCE SELECT | | | | Vbias | RBD | DNP | NU |

| 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|
| COMP. CHANNEL 3 | | | | COMP. CHANNEL 2 | | | | COMP. CHANNEL 0 | | | | MEASUREMENT UNITS | | | |

EXCITATION CURRENT REGISTER

| 7 | 6 | 5 | 4 | 3 | 2 | 1 | 0 |
|---|---|---|---|---|---|---|---|
| NOT USED | NOT USED | NOT USED | IOUT1 DISABLE | IOUT0 DISABLE | IOUT EXCITATION CURRENT | | |

| DIGITAL SENSOR ADDRESS |
| DIGITAL SENSOR CMD 1 |
| DIGITAL SENSOR CMD 2 |
| DIGITAL SENSOR CMD 3 |

FIG. 3

MEASUREMENT SYSTEM

CLAIM OF PRIORITY

This application claims priority to U.S. Provisional Application No. 62/625,747, filed Feb. 2, 2018, the disclosure of which is incorporated by reference herein in its entirety.

TECHNICAL FIELD

This document pertains generally, but not by way of limitation, to integrated chips, and particularly, but not by way of limitation to a measurement system for interfacing a host device to one or more sensors.

BACKGROUND

Electronic devices can be used to facilitate monitoring or control for a variety of applications such as chemical or industrial process control, motion control, building control such as for control of Heating, Ventilation, and Air Conditioning (HVAC), remote monitoring or control, etc. Such electronic devices take measurements, for example, using one or more sensors.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIG. 3 is an example register map that may be provided to configure a measurement system, such as the measurement system of FIG. 2.

DETAILED DESCRIPTION

Figure 1:
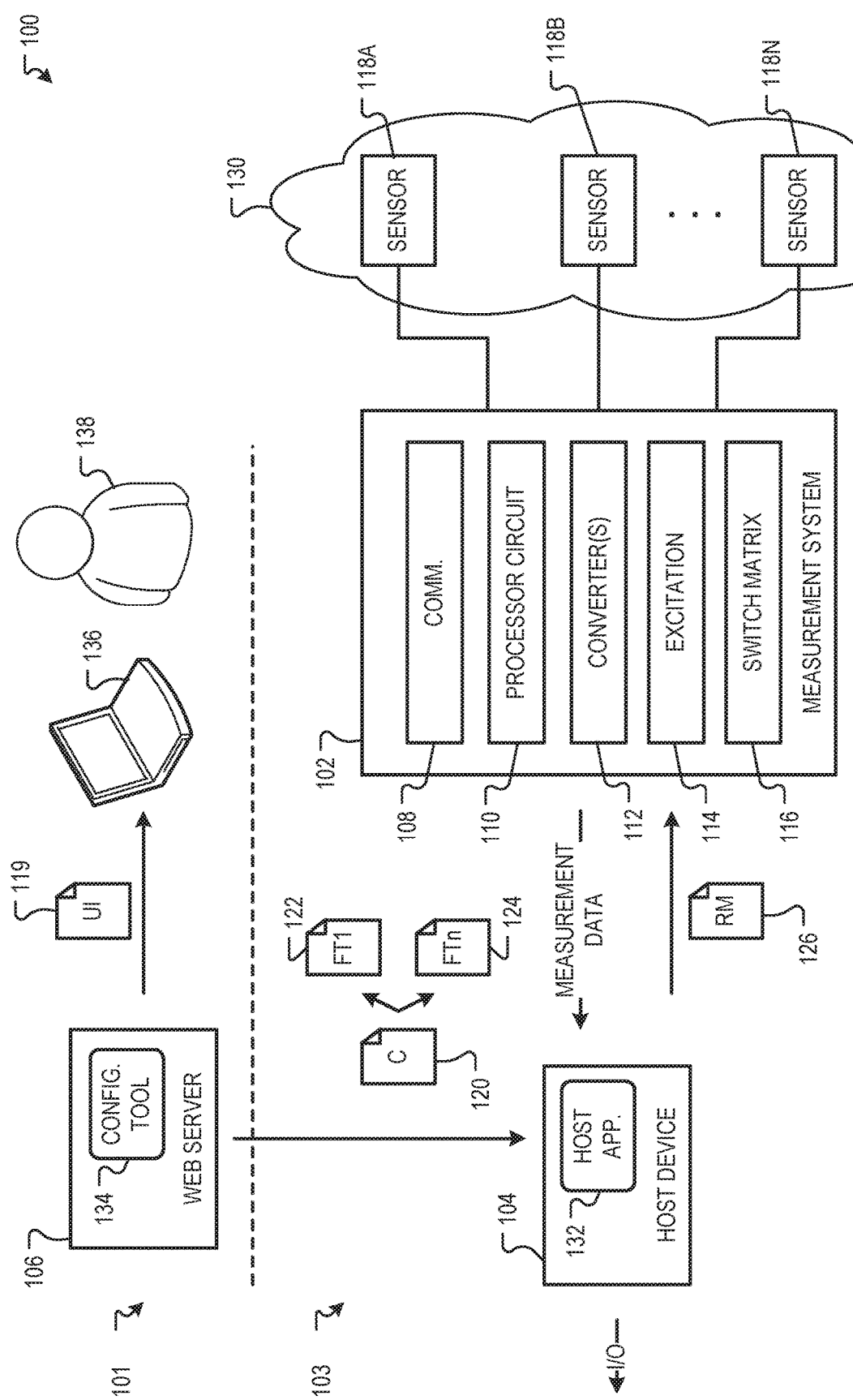
FIG. 1 is a diagram showing one example arrangement of a measurement system.

Various examples described herein are directed to measurement systems and methods for operating and/or configuring a measurement system. A measurement system provides an interface between one or more sensors and a host device, as described herein, For example, the measurement system is configured to drive and/or receive output from various different types of sensors and provide to the host device a digital output signal that is ready for processing by the host device. For example, the measurement system may provide appropriate excitation signals to drive different sensor types. The measurement system may also perform suitable analog-to-digital conversion. In some examples, the measurement system also performs data processing, for example, to provide sensor outputs that are in appropriate measurement units, perform linearization, compensate one sensor output based on another, etc.

The present inventors have recognized, among other things, that configuring a set of sensors for a specific application can be challenging, especially to developers and design teams having expertise that skews towards software. For example, designing sensor hardware for a particular application can involve selecting and arranging suitable sensors, converters, and/or other devices, from a broad range of different available devices having a broad range of configuration options. As a result, it is easy for a developer to select a device that is inappropriate for a particular application, such as a device that fails to meet specified measurement performance objectives.

In some examples, the challenge of sensor circuit design is reduced by providing a measurement system that supports a broad range of sensors and is configurable via a configuration tool that assists with advanced sensor selection and configuration. Providing a measurement system that can be configured to support a large number of different sensors and configurations, however, can create additional challenges. Allowing the developer to modify the measurement system configuration, however, creates opportunities for the developer to err. The complexity of a measurement system configured to support a wide range of sensors increases the opportunities for error. Accordingly, it is desirable to permit a developer to modify a measurement system configuration generated using a configuration tool. Also, in some applications, it is desirable for the measurement system to assume different configurations during use and/or between uses. Some configuration changes may call for the recalibration of various components, such as one or more converters, etc. If the developer fails to recognize the need for recalibration, the accuracy of measurements may suffer.

A measurement system that meets these and/or other customer preferences may include a high degree of complexity. To achieve cost effectiveness both economically and in terms of processing efficiency, various measurement systems described herein are configured with features to enable complex processing with simplified hardware and/or software arrangements.

FIG. 1 is a diagram showing one example arrangement 100 of a measurement system 102, The measurement system 102 is in communication with one or more sensors 118A, 118B, 118N. The measurement system 102 samples sensor signals from the sensors 118A, 118B, 118N. In some examples, sensors 118A, 118B, 118N are omitted. For example, the measurement system 102 may receive one or more electrical signals from a chemical or electrochemical process. In some examples and for some sensors 118A, 118B, 118N, the measurement system 102 also provides suitable excitation. Sensors 118A, 118B, 118N are positioned in ambient environment 130 to sense features of the ambient environment 130. Also, in some examples, the measurement system 102 may perform a unit conversion, linearization, compensation, or other processing on sensor signals sampled by another device.

For example, in a greenhouse application, sensors 118A, 118B, 118N may sense temperature, pressure, and humidity in a greenhouse (where the greenhouse is the ambient environment). Although three sensors 118A, 118B, 118N are shown, any suitable number of sensors may be used. For example, the measurement system 102 may support more or fewer than the three sensors shown. Also, although one ambient environment 130 is shown, sensors 118A, 118B, 118N need not be placed in the same ambient environment. For example, a management system for an internal combustion engine may utilize multiple temperature sensors, with different sensors positioned to measure temperatures at different components of the internal combustion engine.

The measurement system 102 is in communication with a host device 104 that executes a host application 132. The host device 104 may include any suitable type of processor-based system including, for example, an embedded controller, an application specific integrated circuit (ASIC), a field programmable gate array (FPGA), a desktop or laptop personal computer (PC), etc. The measurement system 102 provides measurement data to the host application 132. Measurement data include data received from the sensors 118A, 118B, 118N, In some examples, measurement data include various corrections and/or modifications relative to raw sensor signals sampled from the sensors 118A, 118B, 118N themselves. For example, measurement data may be digital and, therefore, accessible to the host application 132 without the need for (additional) ADCs. Further, measurement data may be linearized to correct for sensor nonlinearities. Also, in some examples, measurement data may be normalized to a selected sensor unit indicating the physical quantities measured by the respective sensors. For example, the sensor unit for a temperature sensor may be degrees Celsius, degrees Kelvin, etc. The sensor unit for a pressure sensor may be pounds per square inch (psi), millimeters of Hg, etc. Also, in some examples, the measurement data is compensated, for example, by adjusting an output based on sensor signals sampled from multiple sensors.

The host application 132 uses the measurement data in any suitable manner. For example, the host application 132 may generate one or more input/output (I/O) signals that are provided to other components such as, for example, one or more motors, or other suitable equipment, that are controlled based on the measurement data. Returning to the greenhouse example above, the host application 132 may be configured to open or close windows or vents of the greenhouse in response to changes in the temperature, pressure and/or humidity.

The measurement system 102 comprises various components including, for example, a switch matrix 116, one or more excitation circuits 114, one or more converters 112 (e.g., ADCs or DACs), one or more processor circuits 110, one or more communication circuits 108, etc. The various components 108, 110, 112, 114, 116 may be formed on a single integrated circuit or, in some examples, on multiple integrated circuits. Also, in some examples, the components 108, 110, 112, 114 are provided in a single integrated package that includes a single integrated circuit or multiple integrated circuits.

The communication circuit 108 is configured to communicate with the host device 104. The processor circuit 110 executes firmware for controlling the measurement system 102. Converters 112 are configured to convert analog sensor input signals to digital (ADCs) and/or to convert digital excitation signals to analog (DACs). Excitation circuits 114 are configurable to provide excitation signals to any sensors 118A, 118B, 118N that receive an excitation voltage or current in use. The switch matrix 116 is configured to selectively couple the various sensors 118A, 118B, 118N to suitable converters 112, excitation circuits 114, etc., as described herein. In some examples, the various components of the measurement system 102 are implemented on a single integrated circuit or on a series of integrated circuits. For example, the measurement system 102 may include an ASIC, an FPGA, a digital signal processor, etc.

The measurement system 102 is configurable to support a broad range of different types and combinations of sensor types. For example, the host application 132 generates and/or receives configuration data 120 that describes the configuration of the measurement system 102. For example, the configuration data 120 describes a configuration of the measurement system for a particular set of sensors to make a particular set of measurement data. The configuration data 120 may include files or other delineations of data in various formats 122, 124, For example, configuration data for the measurement system 102 may be expressed in a syntax, such as the C programming language in one format, and in a human-readable syntax such as JavaScript Object Notation (JSON) in another format 124. In some examples, the different formats 122, 124 represents the same configuration data 120.

All or part of the configuration data 120 is translated into register maps 126. In some examples, the host application 132 or other suitable application at the host device 104 interprets and/or translates the configuration data 120 to generate the register maps. Also, in some examples, the configuration data 120 is fully or partially translated before it is provided to the host application 132. For example, the host application may receive one or more register maps 126 in addition to or in lieu of the configuration data 120. The host application 132 provides the register maps 126 to the measurement system 102, for example, during an initial configuration and/or at start-up. For example, the measurement system 102 may include an application programming interface (API) for receiving and applying the register map. In some examples, the host application 132 modifies a register map 126 before it is provided to the measurement system 102. In this way, the host application 132 may be programmed to deviate from the configuration of the measurement system 102 called for by the configuration data 120. Also, in some examples, the host application 132 provides a new or updated register map during execution, as described herein.

The host device 104, measurement system 102, and sensors 118A, 118B, 118N are part of a production environment 103. The arrangement 100 also includes an example development environment 101 comprising a web server 106 that executes a configuration tool 134. The configuration tool 134 provides a user interface (UI) 119 to a user 138 via a user computing device 136. The user computing device 136 may be or include any suitable computing device such as, for example, a desktop computer, a laptop computer, a tablet computer, mobile telephone, etc. The configuration tool 134, via the UI 119, provides the user 138 with a step-by-step process for configuring the measurement system 102. For example, via the UI 119, the user 138 selects one or more physical quantities to be sensed, a desired accuracy for the physical quantities, and/or other parameters for the measurements. The configuration tool 134 may recommend one or more sensors 118A, 118B, 118N and generate configuration data 120 for the recommended sensors and configurations. The resulting configuration data 120 is provided to the host application 132, for example, from the configuration tool 134 and/or from the user computing device 136. In some examples, configuration data 120 generated by the configuration tool 134 is used without modification. In other examples, the user 138 may modify a configuration data 120 to suit design constraints of their particular application. For example, when the user 138 is more sophisticated and/or where the application calls for it, the user 138 may have the option to modify the configuration data 120 to fine tune the operation of the measurement system 102. In other examples, where the application is simple and/or where the user 138 is less sophisticated, the configuration data 120 generated by the configuration tool 134 may be used without modification.

Figure 2:
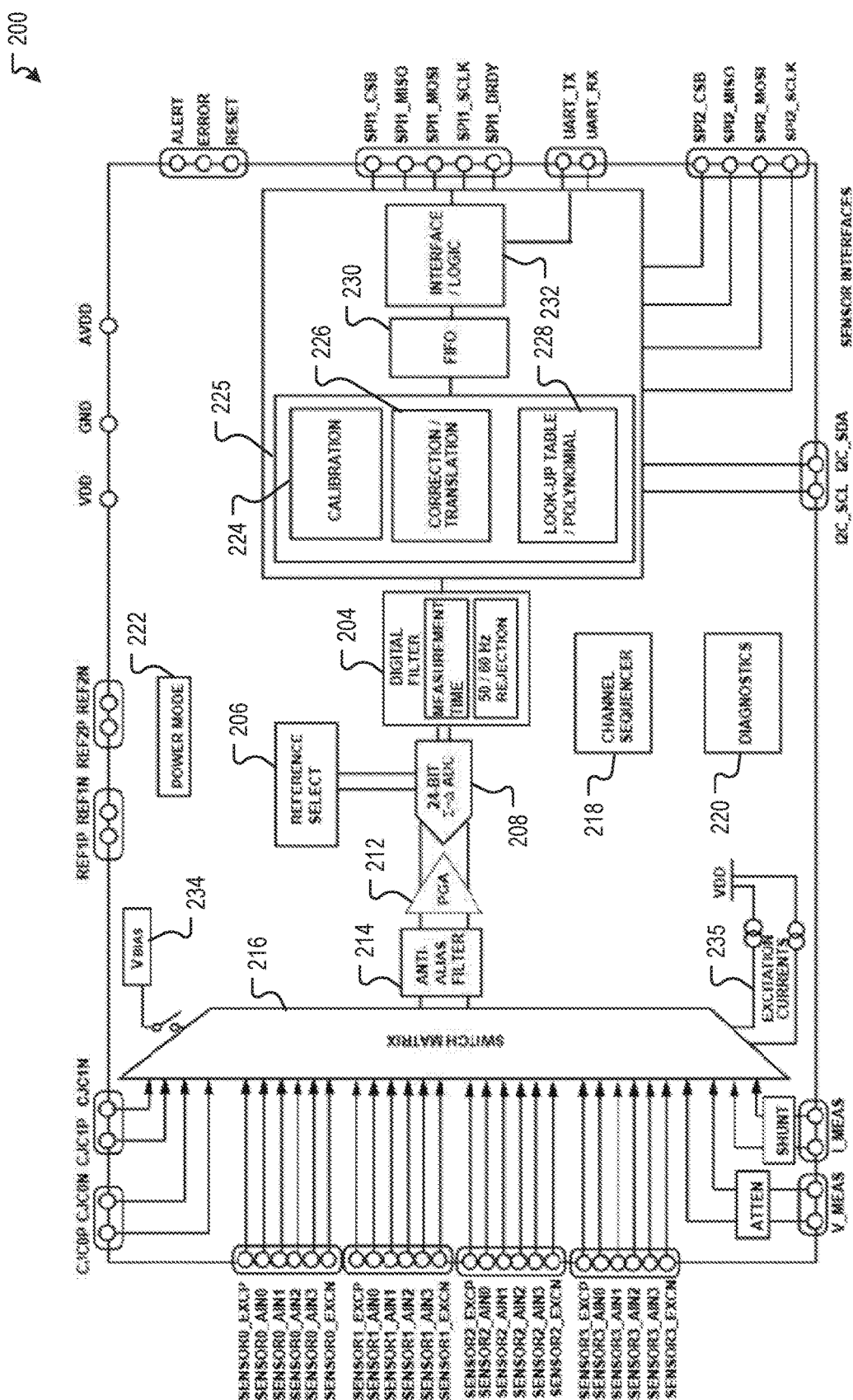
FIG. 2 is a functional diagram showing one example of a measurement system.

FIG. 2 is a functional diagram showing one example of a measurement system 200. The functional diagram of FIG. 2 shows various components of the measurement system 200 including, for example, a digital filter 204, an ADC 208, a programmable gain amplifier 212, an anti-aliasing filter 214, a multiplexer or switch matrix 216 and various input/output (I/O) devices. Functional diagram of FIG. 2 also shows various functional blocks executed by and/or stored at a processor circuit of the measurement system 200 such as, for example, interface/logic 232, channel sequencer 218, etc. These functional blocks may be executed by a processor circuit, such as the processor circuit 110 shown in FIG. 1.

The switch matrix 216 is controllable to alternatively connect different sensor channels to the various other components of the measurement system 200. In the example shown in FIG. 2, the measurement system 200 comprises four analog sensor channels (SENSOR0, SENSOR1, SENSOR 2, SENSOR3). The analog sensor channels include a sensor excitation positive pin (EXCP) and a sensor excitation negative pin (EXCN) as well as signal input pins AIN0, AIN1, AIN2, AIN3. Although two excitation pins are shown per channel, some channels may have additional sensor excitation pins. Also, although four signal input pins are shown per channel, sensor channels may have any suitable number of signal input pins and some sensor channels may have a different number of signal input pins than others. Some or all of the pins described herein are configurable, for example, to act as input or output pins.

The switch matrix 216 may also receive a bias voltage from a bias voltage generator 234. By selectively connecting the switch matrix 216, the bias voltage may be provided to any of the analog sensor channels. Similarly, an excitation current generator 235 generates one or more excitation currents that may be provided to any of the analog sensor channels SENSOR 0, SENSOR 1, SENSOR2, SENSOR 3 by selectively arranging the switch matrix 216. For example, bias voltages generated by the bias voltage generate 234 and/or excitation currents generated by the excitation current generator 235 may be provided to one or more of the analog sensor channels, for example, across excitation pins EXCP, EXCN. In the example of FIG. 2, the measurement system also includes input channels (CJC0 and CJC1), that may be used, for example, when a thermocouple sensor is used on one of the analog sensor channels SENSOR 0, SENSOR 1, SENSOR2, SENSOR 3, a 2-wire resistive temperature device (RTD) may be positioned to measure a cold junction temperature of the thermocouple and connected at one of the input channels CJC0, CJC1. In some examples, channels CJC0, CJC1 may also be configurable to provide an excitation current or voltage to one of the other channels SENSOR 0, SENSOR 1, SENSOR 2, SENSOR 3, and/or to a sensor on another CJC pin. In some examples, multiple sensor channels are used to interface with a single sensor. For example, consider an RTD sensor including two or more wires. One channel may be used to provide cold junction compensation while another channel includes a thermocouple for measuring the temperature of the junction.

Additionally, a voltage measure (V_MEAS) channel is configured for receiving and measuring a sensor input above the operating voltage of the measurement system 200. For example, an attenuator network (ATTEN) reduces sensor input to a voltage readable by various components of the measurement system 200, such as the switch matrix 216. Similarly, a current measurement channel (I_MEAS) includes a shunt circuit to find a voltage indicating a measured current. When the current measurement channel is switched into the current, other channels may be switched out. In the event of a fault condition on one channel, this may prevent the fault condition from affecting other channels.

In the example of FIG. 2, the measurement system 200 is also configured to interface one or more digital sensors via a digital interface. For example, the SPI2 channel is arranged according to the Serial Peripheral Interface (SPI) protocol and includes a clock pin (SPI2_SCLK) for receiving and/or providing a sensor clock, a master in/slave out pin (SPI2_MISO) and master out/slave in (SPI2_MOSI) for receiving digital data and a chip select output pin (SPI2_CSB) for selecting a particular digital sensor. Another digital sensor channel (I2C) is arranged according to the Inter-Integrated Circuit (I2C) protocol and includes a clock pin (I2C_SCL) and serial data pin (I2C_SDA).

The measurement system 200 also includes a signal processing path between the switch matrix 216 and the processor circuit. Various signal processing components may be switched into and/or out of the signal path for a given sensor including, for example, a programmable gain amplifier 212, an ADC 208, and one or more digital filters 204. Analog components of the measurement system 200 such as, for example, the excitation current generator 235, the bias voltage generator 234, the anti-aliasing filter 214, the PGA 212, etc., may be collectively referred to as the analog front end. In the example of FIG. 2, the ADC 208 is a sigma-delta ADC, although other types of ADCs may be used. A reference select module 206 selects a reference voltage for the ADC 208. Also, in the example of FIG. 2, digital filter 204 includes a measurement time filter for setting a measurement time of the ADC 208 and a 50/60 Hz rejection filter. Digital filter 204, in some examples, is a component of the ADC 208 (e.g., included on a common IC with the ADC 208) or may be implemented, for example, by a digital signal processor or other suitable processor, by an ASIC, by a PGA, etc.

A power mode selector 222 may be configured, for example, by configuration data and may set a power mode for the measurement system 200. For example, the measurement system 200 may have full, middle, and low power modes. Some examples include dynamic power mode. For example, the power level of the measurement system 200 may be set by the provided register map. A diagnostics block 220 may be executed by a processor circuit and may be configured to perform various diagnostics on the measurement system 200 including, for example, to determine whether the configuration of the measurement system 200 is consistent and/or whether hardware (e.g., sensors, etc.) is correctly connected to the measurement system 200. The channel sequencer 218 may be executed by a processor circuit and is configured to select a sequence for connecting the various sensor channels to the processor circuit. The channel sequencer 218, diagnostics block 220, and/or power mode selector 222 may be implemented as software (e.g., firmware) executed by the processor circuit and/or as separate hardware. In some examples, the channel sequencer 218 is also configured to insert a delay after configuring the switch-matrix 216, and sometimes after beginning to provide excitation signals. The may allow the sensor output and/or PGA output sufficient time to settle to a stable value before the ADC is instructed to perform a conversion. In some example, the delays for different channels are adjustable by the user via parameters in the configuration data.

FIG. 2 shows various memory and data structures that may be included in and/or stored at a processor circuit. For example, calibration data 224 describes a current calibration of one or more components of the measurement system 200. Correction/translation data 226 is used, for example, as described herein, to provide correction of raw sensor signals and/or translation of raw sensor signals to a desired unit. Look-up table LUT and/or polynomial data 228 (also described in more detail herein) is utilized by the processor circuit to simplify run-time calculations for converting raw sensor signals to correct units. The LUT/polynomial data 228 may be determined by the user, calculated by the host device, calculated by the measurements system, and/or provided by sensor manufacturers. In some examples, the LUT/polynomial data 228 is used to provide correction or translation, for example, for sensors that do not have built-in correction or translation data at correction/translation data 228. For example, the user may supply correction or translation data that is provided as a LUT or equation stored at LUT/polynomial data 228. The example of FIG. 2 also includes a memory queue 230 (First In First Out or FIFO) that may store processed measurement data to be provided to the host application.

An interface/logic block 232 may be executed, for example, by a processor circuit and arranges communications between the measurement system 200 and the host device/host application. in the example of FIG. 2, the interface/logic block 232 supports an SPI channel (SPI1_CSB, SPI1_MISO, SPI1_MOSI, SPI1_SCLK, SPI_DRDY) and a universal asynchronous receiver transmitter (UART) channel that may be used to communicate with the host application/device and/or for sensor data collection. The interface/logic block 232 may be executed by a processor circuit. In some examples, the interface/logic block 232 sends a message to the host application when the queue 230 is sufficiently filled with sensor readings and ready to be read.

The example measurement system 200 of FIG. 2 also includes a VDD, GND, and AVDD pins for powering the measurement system 200. VDD receives a voltage for powering the digital portions of the measurement system 200 while AVDD receives a voltage for powering the analog portions of the measurement system 200. The VDD and AVDD pins are referenced to the ground pin GND. Also, the measurement system 200 may be configured to assert an ALERT pin of the measurement system 200 when an alert condition is present and to assert an ERROR pin when an error is detected. The host device may assert the RESET pin to reset the measurement system 200.

FIG. 3 is an example register map that may be provided to configure a measurement system, such as the measurement system 200 of FIG. 2. FIG. 3 shows a Sensor Details Register, an Excitation Current Register, a Digital Sensor Address register, and three digital command registers (Digital Sensor Cmd 1, Digital Sensor Cmd 2, Digital Sensor Cmd 3). The register map of FIG. 3 shows example registers describing the configuration of the measurement system 200 for a single sensor. Additional register values may be provided, for example, to configure the measurement system 200 for other/additional sensors and/or to provide other configuration parameters.

The Sensor Details Register shows example bits that may describe a sensor connected to the measurement system. For example, the measurement system may include a Sensor Details Register for each sensor connected thereto (e.g., each analog sensor). The Sensor Details Register may include bits describing, averaging for the sensor, the PGA gain for the sensor, a reference select for the sensor (e.g., describing a reference for the ADC), a bias voltage for the sensor, compensation channel settings for the sensor, and measurement units for the sensor.

Averaging for the sensor may describe how, if at all, raw sensor signals for the sensor will be averaged by the measurement system. For example, the measurement system may average raw sensor signals from one or more signals. Also, some sensors, such as 3 or 4-wire RTD sensors, are provided with multiple excitation currents. In some examples, the measurement system is configured to sample multiple raw sensor signals from the sensor for each measurement data, with the excitation currents changed (e.g., swapped) between sensor signals. The measurement system then averages the multiple sensor signals to generate the measurement data. The averaging bits describe whether and how averaging will occur for a given sensor. PGA gain bits describe a gain for the PGA that will be used for the sensor. Reference bits describe a reference signal for the ADC that will be used for the sensor. A bias voltage bit (Vbias) indicates whether a bias voltage is provided to the sensor. A reference buffer disable (RBD) bit indicates whether the ADC reference buffering should be disabled. Compensation channel bits describe compensations that are to be performed for the sensor. Compensations including, for example, compensations for ambient conditions, such as ambient temperature, pressure, etc. Measurement unit bits describe the units in which the measurement data for the sensor should be expressed.

The Excitation Current Register shows example bits that describe an excitation current or currents that are to be provided to a sensor. For example, The Iout1) and Iout0 Disable bits may indicate that Iout1 or Iout0 should be disabled. The Iout excitation current bits indicate a value for the excitation current.

The Digital Sensor Address and Digital Sensor Cmd1-3 are used for digital sensors. For example, the Digital Sensor Address register indicates an address of a digital sensor, for example, on the I2C bus described above and/or the address of a register where the sensor output is provided. The Digital Sensor Cmd1-3 registers indicate commands that may be provided to the digital sensor, for example, to configure the digital sensor to a selected mode of operation, a selected range, a selected bandwidth mode, etc. In the example register maps of FIG. 3, several bits are marked "Not Used"

or "NU." These bits are not used in the example register map shown in FIG. 3, but may be used in other register map arrangements.

Figure 4:
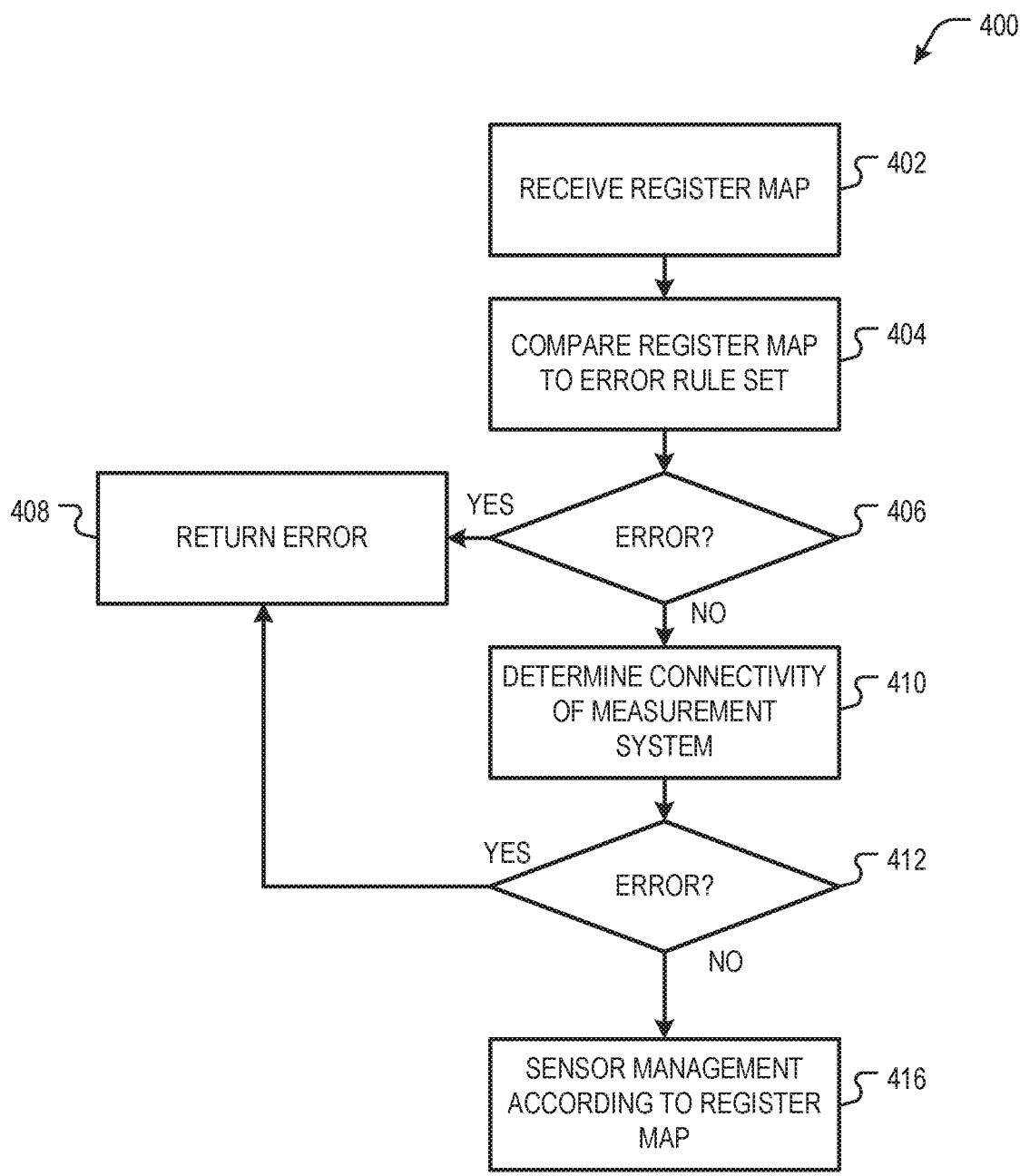
FIG. 4 is a flow chart showing one example of a process flow that may be executed by a measurement system upon receipt of a register map.

FIG. 4 is a flow chart showing one example of a process flow 400 that may be executed by a measurement system (e.g., a processor circuit of the measurement system) upon receipt of a register map. At operation 402, the measurement system receives a register map. The register map may be received from a host application executing at a host device and may describe a configuration for the measurement system. For example, referring to the example of FIG. 3, a register map may include a set of values for the registers of FIG. 3. In some examples, the register map includes a set of values for the registers of FIG. 3 for each sensor to be managed by the device. For example, if three sensors are to be managed by the measurement system, the register map may include three sets of values for the registers of FIG. 3. Also, it will be appreciated that the registers of FIG. 3 provide just one example of how a register map (or parts thereof) for a measurement system may be arranged.

The measurement system may receive the register map at any suitable point in its operation. In some examples, the host application is configured to provide a register map to the measurement system upon start-up. Also, in some examples, the host application provides the measurement system with different register maps at different points during operation. For example, the measurement system may receive one register map that instructs it to sample raw sensor signals according to one configuration. During operation of the host application, it may provide another register map to configure the measurement system to sample additional raw sensor signals according to another configuration. For example, if during the operation with the first register map a limit is trespassed in a particular sensor, the host can be programmed to send a new configuration that changes the excitation current to another value which allows continuing measuring without trespassing any limit. In another example, a sensor may show sudden variations in its value. In response, another register map is sent to the device to sample that particular sensor at a higher speed to monitor it in a more often. In some examples, the host application provides the measurement system with multiple register maps and the measurement system is configured to automatically switch between register maps on the occurrence of a change condition, such as a threshold sensor output being reached, etc.

At operation 404, the measurement system compares the received register map to an error rule set. The error rule set identifies register maps that are inconsistent or incorrect. For example, some rules of the error rule set define registers and/or bits that should or should not have values for a particular sensor type. An error rule specifies that a register map indicating a sensor that requires an excitation current should also provide an excitation current value. Also, for example, a register map that indicates digital filtering parameters that are inconsistent with a selected sensor may fail the error rule set. Another example error rule specifies register values/ranges that are inconsistent with a selected sensor. For example, a specified sensor type may require an excitation current above a threshold level. An example error rule may specify that a register map indicating that sensor type should also indicate an excitation current value above the threshold.

At operation 406, the measurement system determines if the register map violates any error rules of the error rule. If yes, the measurement system returns an error at operation 408. For example, referring to the example of FIG. 2, the processor circuit may assert the ERROR bit and may not proceed to operate according to the (erroneous) register map.

If no error rules are violated, the measurement system determines, at operation 410, its connectivity. Determining the connectivity of the measurement system includes determining which pins of the measurement system are connected to other components, such as sensors. To determine connectivity, the processor circuit may cause a voltage to be present across two or more pins (e.g., a signal pin and a ground pin for a channel). The current between the pins may be measured (e.g., with a shunt resister) and the impedance between the pins derived therefrom. Other suitable techniques for determining the conductivity of the measurement system may also be used.

At operation 412, the measurement system determines if there is a connectivity error. A connectivity error occurs if the measurement system (e.g., the processor circuit thereof) determines that a sensor indicated by the register map is not actually connected to the device, or not connected correctly. For example, if the register map calls for a three-wire RTD device to be connected at a first channel, but the measurement system fails to detect connections to the three wires (e.g., (determines that the impedance across the appropriate pins at the first channel is an open circuit), an error may be detected. Also, in some examples, if a register map calls for a sensor with leads that have different impedance characteristics, and the measurement system determines that the leads are not connected to the correct pins, an error may be detected. If an error is detected, the measurement system may return an error at operation 408. If no error is detected, the measurement system may. proceed to manage the sensors indicated according to the received register map at operation 416.

Figure 5:
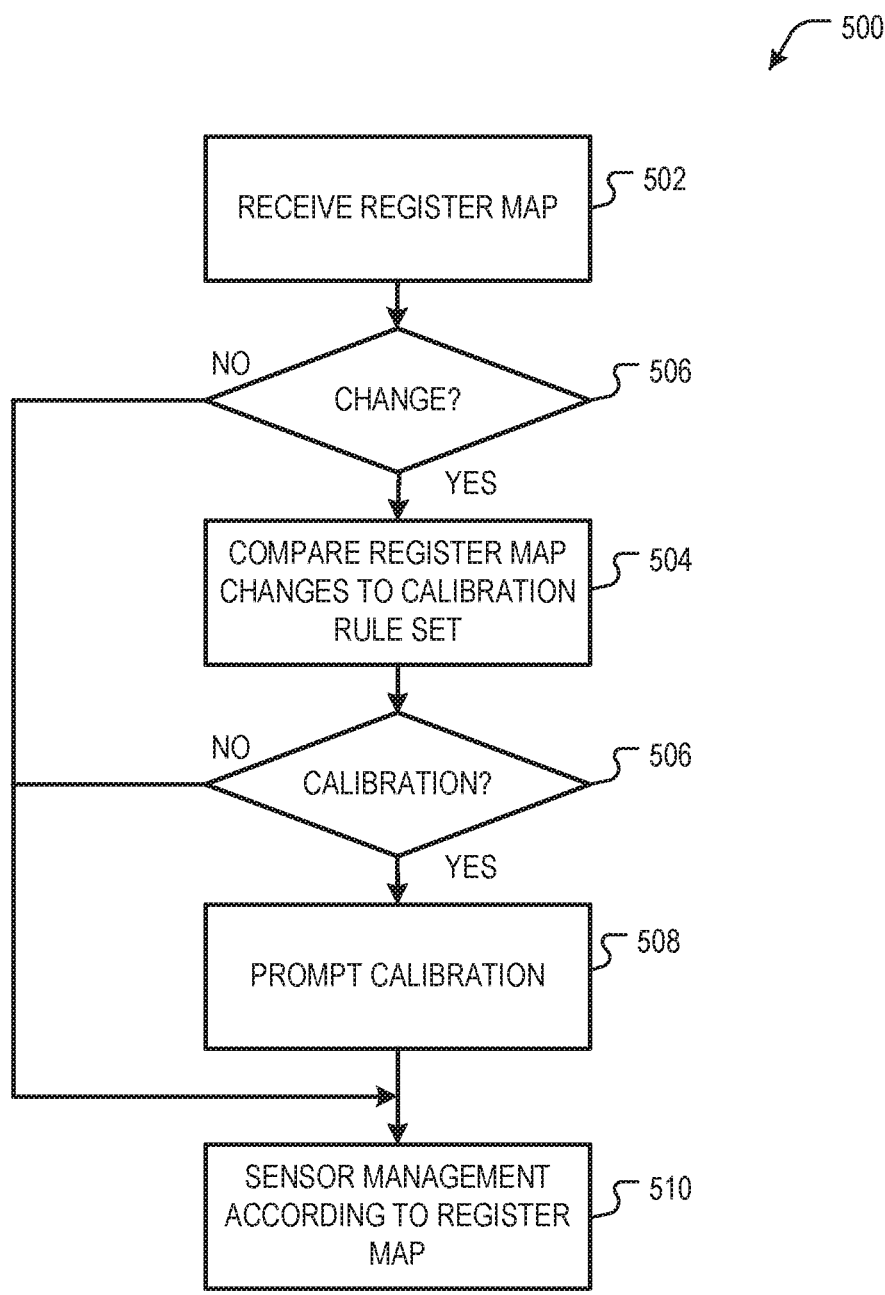
FIG. 5 is a flow chart showing one example of a process flow that may be executed by the measurement system upon receiving a register map to determine if a calibration of the measurement system should be performed.

FIG. 5 is a flow chart showing one example of a process flow 500 that may be executed by the measurement system upon receiving a register map to determine if a calibration of the measurement system should be performed. For example, various components of the measurement system, such as, for example, PGAs, filters, ADCs, etc., are calibrated. Some components, such as converters, are configured to self-calibrate. Other components are calibrated by the processor circuit of the measurement system. In some examples, multiple components may be calibrated together. For example, in some implementations of the measurement system 200 shown in FIG. 2, the ADC 208 and PGA 212 may be auto-calibrated together.

At operation 502, the measurement system receives a register map. At operation 506, the measurement system determines if the received register map is different than the previous register map. For example, the measurement system may store all or part of a previous register map at a memory and may compare the received register map to the previous register map. If there is no difference, then, the measurement system may proceed to manage sensors according to the received register map at operation 510.

If the received register map is different than a previous register map, the measurement system compares the received register map to a calibration rule set. The calibration rule set identifies changes to the configuration of the measurement system that call for the calibration (or re-calibration) of one or more components. For example, the received register map may call for a change to the gain of the PGA, making it desirable to re-calibrate the ADC with the new value of the PGA. Also, for example, the received register map may call for a change to the excitation current or currents for a sensor, making it desirable to re-calibrate the ADC and/or linearization equations or look-up tables (LUTs) in view of the new excitation current.

At operation 506, the measurement system determines if the comparison to the calibration rule set at operation 504 indicated that one or more components of the measurement system should be calibrated. If not, the measurement system may proceed to manage sensors according to the received register map at operation 510. If a calibration is indicated at operation 506, the measurement system prompts the calibration at operation 508. For example, the processor circuit may prompt a component, such as the ADC or other converter, to perform a self-calibration in the new configuration. Also, in some examples, the processor circuit itself may make changes to equation coefficients and/or a LUT for linearization and/or unit conversion. After calibration, the measurement system may proceed to manage sensors according to the received register map at operation 510.

Figure 6:
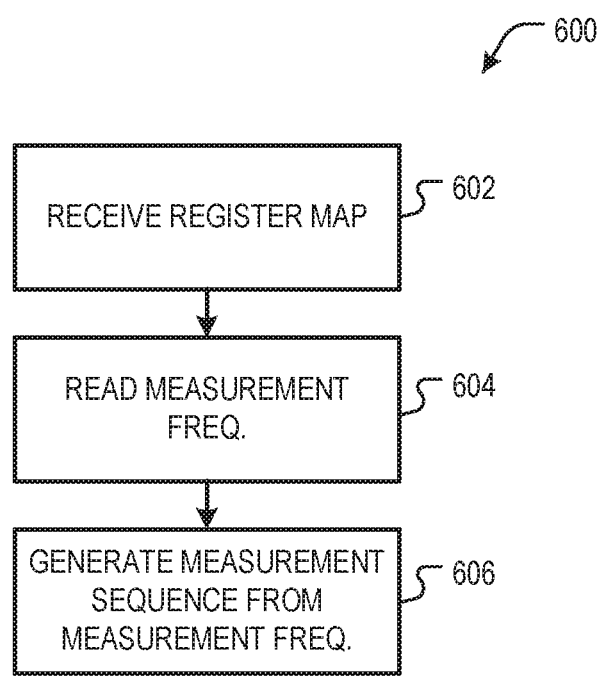
FIG. 6 is a flow chart showing one example of a process flow that may be executed by a measurement system upon receiving a register map to determine a measurement sequence.

FIG. 6 is a flow chart showing one example of a process flow 600 that may be executed by a measurement system upon receiving a register map to determine a measurement sequence. A measurement sequence describes when measurement data will be provided from the different sensors managed by the measurement system. In some examples, the measurement system automatically determines the measurement sequence. In this way, the developer may indicate the number of measurement data desired from each sensor and/or the frequency of desired measurement data without specifically arranging the measurement system sequencing.

At operation 602, the measurement system receives a register map. At operation 604, the measurement system reads measurement cycle data for the various sensors indicated by the register map. For example, the register map may indicate, for each sensor of the configuration represented by the register map, a measurement frequency indicating how often the host application will expect a measurement data from that sensor. In some examples, the register map also indicates the order in which sensors are to be sampled. Consider again the example from above of the greenhouse system that measures temperature, humidity, and pressure. A register map for the measurement system in that example may indicate that a temperature is to be taken every quarter-hour, while pressure and humidity are to be measured every hour.

At operation 606, the measurement system generates a measurement sequence for the measurement system based on the measurement frequencies of the register map. This may include, for example, determining a measurement cycle length and determining an order and/or position in the measurement cycle during which each sensor will be sampled. In some examples, one or more sensors may not be sampled every cycle. Each sensor may be sampled a predetermined number of times during the measurement cycle. For example, consider again the greenhouse example from above. The measurement cycle time for that example may be one hour and the sample order may be temperature, pressure, humidity, pressure, humidity, pressure, humidity, pressure, humidity. The processor circuit of the measurement system (e.g., a sequencer executed thereby) may arrange the measurement system to sample raw sensor signals according to the determined sequence. Sampling a raw sensor signal from a sensor may include configuring the switch matrix to couple the input or output pins associated with the sensor to the analog front end, and configuring the analog front end and ADC (if the sensor is analog), and any digital filters according to the configuration associated with the sensor.

Figure 7:
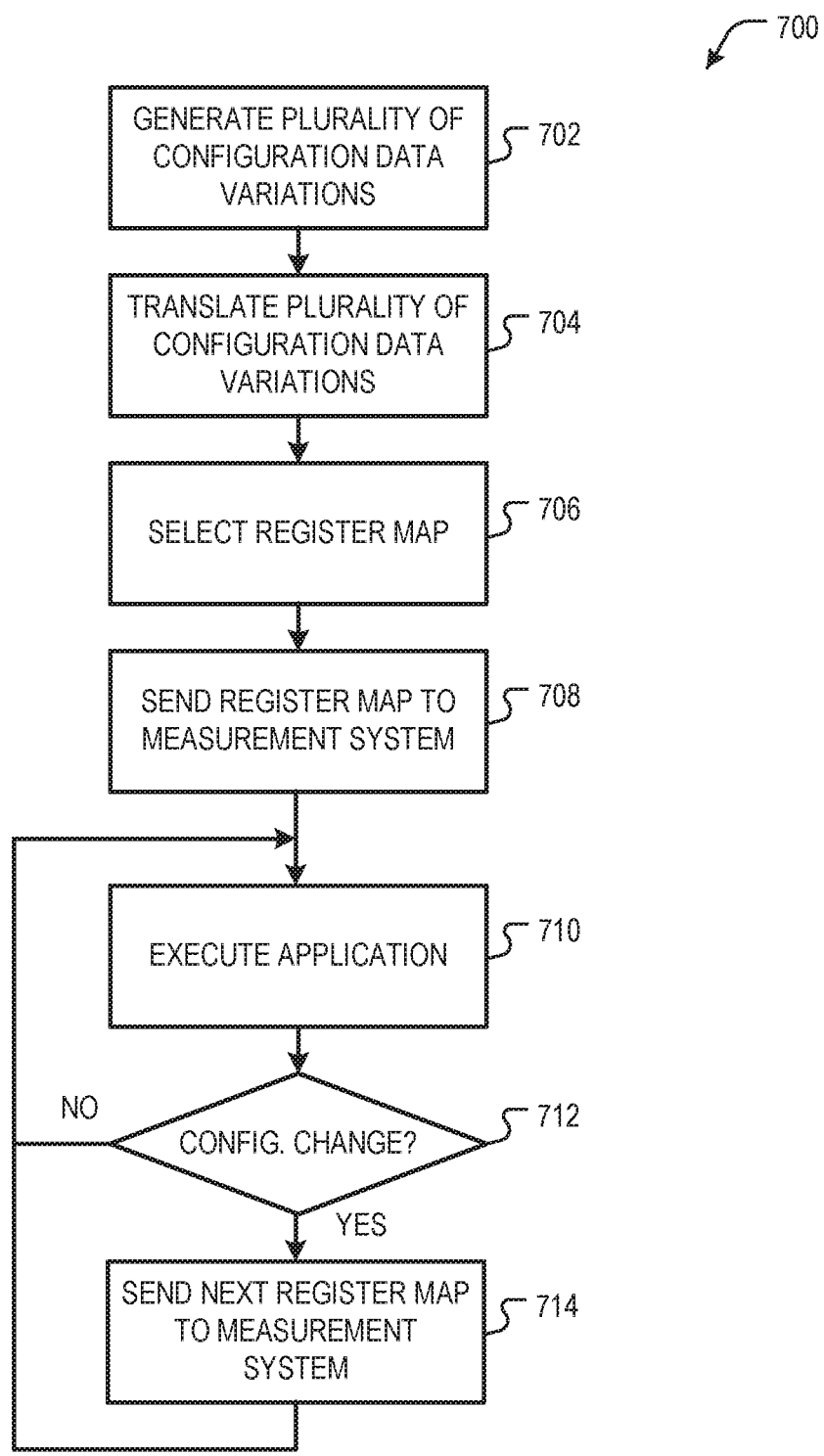
FIG. 7 is a flow chart showing one example of a process flow that may be executed to manage a measurement system.

FIG. 7 is a flow chart showing one example of a process flow 700 for managing a measurement system. At operation 702, a plurality of configuration data variations are generated. Generating a configuration data variation may include determining alternative configurations for the measurement system. Different configuration data variations may be stored in a single file or in multiple files. Alternative configurations vary configuration parameters for the measurement system such as, for example, the number and/or type of active sensor channels, excitation currents, PGA gains, etc. The plurality of configuration data variations may be automatically determined by the host application, may be generated by a configuration tool, and/or may be configured by a user 138. Also, configuration data variations determined at operation 702 may be expressed in any suitable format. The configuration data variations may be generated in the development environment (e.g., by a configuration tool alone or in conjunction with the user 138 and user computing device).

At operation 704, the plurality of configuration data variations determined at operation 704 are translated (e.g., compiled and/or interpreted) to form a plurality of register maps. In some examples, a user (via a user computing device) adds one or more register map variations that cause one or more of the register maps to deviate from the configuration data. Translation of configuration data into register maps may be performed by the host application, another application executing at the host device, by a user computing device of a developer, or by another suitable device.

At operation 706, the host application selects a register map to be provided to the measurement system. The selected register map corresponds to a first configuration data variation of the plurality of configuration data variations and to a particular configuration of the measurement system. The host application selects the register map based on any suitable criteria. At operation 708, the host application sends the selected register map to the measurement system. In response, the measurement system configures itself according to the received register map.

At operation 710, the host application continues to execute, for example, receiving measurement data from the measurement system according to the provided register map. At operation 712, the host application determines if a configuration change should occur for the measurement system. If not, the host application may continue to execute at operation 710. If a configuration change is determined, the host application selects and sends a next register map to the measurement system at operation 714. In response, the measurement system configures itself according to the received register map and continues to execute at operation 710.

Referring back to operation 712, the host application may determine that a configuration change for the measurement system should occur for any suitable reason or reasons. For example, the measurement system may be capturing measurement data from a first sensor on a first channel while another channel is not in use. If an unexpected result is received on the first channel, the host application may determine that the measurement device should be reconfigured to utilize additional sensors on other channels to understand the reason for the unexpected data. Also, in some example, the measurement device may be configured to excite and/or sample a sensor in a first way according to a first configuration. If the raw sensor readings, or other resulting value, are over a limit (e.g., saturated), then the host application may change the configuration with respect to that sensor and continue executing at operation 710.

Figure 8:
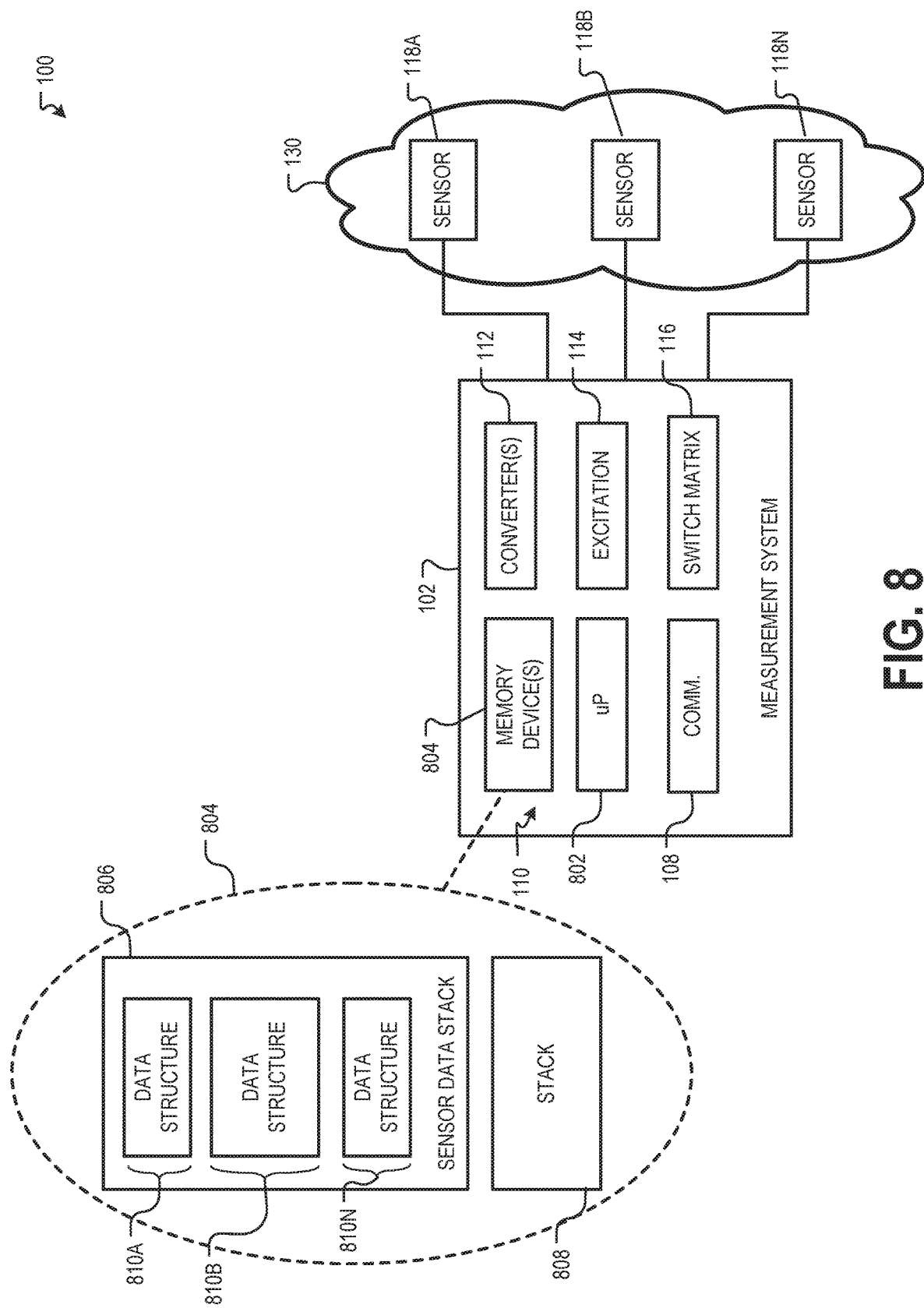
FIG. 8 is a diagram showing another example of the arrangement of FIG. 1 including additional details of an example processor circuit.

FIG. 8 is a diagram showing another example of the arrangement 100 including additional details of an example processor circuit 110. In the example of FIG. 8, the processor circuit 110 includes a processor 802 and a memory device 804. The processor 802 may be any suitable type of processor including, for example, an embedded microcontroller. The memory device 804 may include any suitable type of memory device or devices including, for example, a flash memory device, a random access memory (RAM) device, etc. The processor circuit 110 may store sensor data structures in both a persistent memory device, such as a flash memory device, and at a RAM device, such as a static RAM (SRAM) device.

In some examples, it is desirable to minimize the number of memory locations that are used by the processor circuit. This may reduce the amount of memory included with the measurement system, thereby decreasing its cost and potentially also decreasing its size and/or power consumption. In some examples, the processor circuit 110 is configured to implement a dynamic sensor data stack. For example, the processor circuit may store data structures, such as LUTs or other tables, including values for linearizing raw samples of sensor signals, and/or for converting sensor signals to appropriate units, etc. The size of the data structures used for different sensors may be different. For example, a sensor with a complex linearization calculation may use a large data structure for linearization while a sensor with a simpler linearization calculation may use a smaller data structure. Also, for example, different sensors may include different numbers of sensor data structures. For example, a sensor whose raw sensor signal requires linearization may be associated with a linearization data structure, whereas a sensor that does not require linearization may not. Instead of allocating each data structure a fixed amount of memory, regardless of size, the processor circuit may be configured to implement a dynamic sensor data structure stack. For example, FIG. 8 shows a detail of the memory device 804 showing two memory stacks 808 and 806. The stack 808 is a local variable stack that may be allocated at compile time. The sensor data stack 806 includes a number of data structures 810A, 810B, 810N, where the data structures are dynamically allocated so as to save memory space.

Figure 9:
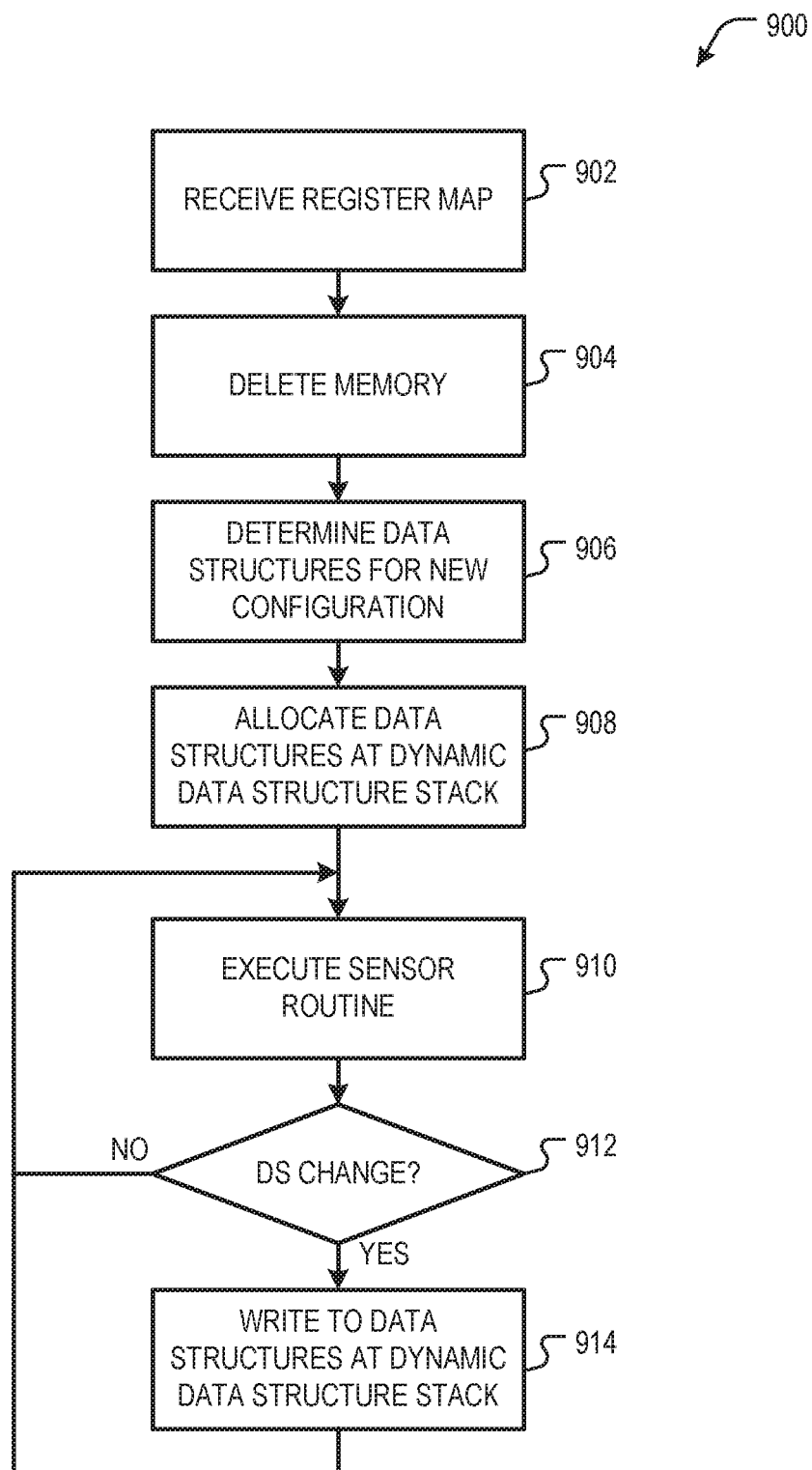
FIG. 9 is a flow chart showing one example of a process flow that may be executed by the processor circuit of the measurement system to dynamically allocate sensor data structures.

FIG. 9 is a flow chart showing one example of a process flow 900 that may be executed by the processor circuit 110 of the measurement system to dynamically allocate sensor data structures. At operation 902, the processor circuit 110 receives a register map. At operation 904, the processor circuit 110 deletes the memory device 804. This may include, for example, erasing the memory device 804 and/or deallocating memory locations from any data structures that had previously been allocated.

At operation 906, the processor circuit 110 determines data structures for the configuration associated with the received register map. As described herein, the register map indicates the sensors that are to be managed by the measurement system. Each sensor (or type of sensor) is associated with linearization processing and a unit transformation. The linearization processing and unit transformation may be associated with one or more data structures used at run time. For example, linearization processing may be associated with a LUT and/or with a set of coefficients for deterministically generating a linearized sensor response. Unit transformation may also be associated with a LUT and/or coefficient set. For example, a temperature sensor may provide an output of X Volts. Performing unit transformation may include transforming X Volts into a corresponding temperature.

At operation 908, the processor circuit 110 allocates data structures for the selected sensors at sensor data stack. The amount of memory allocated to each data structure may be based on the size of the data structure, The processor circuit 110 stores the memory addresses associated with the allocation for each data structure. in some examples, sensor data structures are allocated to contiguous memory addresses. Allocating sensor data structures dynamically to contiguous memory locations, as described may reduce, the total number of memory locations used.

An example structure for the sensor data stack is given by TABLE 1 below:

TABLE 1

| HEADER |
| --- |
| DESCRIPTOR0 |
| DATA0[. . .] |
| DESCRITPTOR1 |
| DATA1[. . .] |
| DESCRIPTOR2 |
| DATA2[. . .] |
| . . . |
| DESCRIPTORn |
| DATAn[. . .] |

In TABLE 1, the sensor data stack is described by a header. The header indicates various data about the sensor data stack including, for example, a total number of sensor data structures stored at the stack and a total length (e.g., in bytes) of all sensor data structures.

After the header are multiple data structures, labeled 0, 1, 2, n, where each data structure includes a descriptor and a data section. A data structure descriptor includes a description of a data structure and the data elements included in the data structure. An example arrangement of a sensor data structure descriptor is provided by TABLE 2 below:

TABLE 2

| 28-31 | 16-27 | 12-15 | 6-11 | 0-5 |
| --- | --- | --- | --- | --- |
| Data Type | Sensor Type | Direction | Equation Type | Data Structure Geometry |
| 48-63 | | 32-47 | | |
| Error Detection Code | | Length | | |

In the example of TABLE 2, the sensor data structure descriptor is 64 bits in length (e.g., 8-bytes) and includes fields for data structure geometry, equation type, direction, sensor type, data type, error detection code, and length. Example sizes and corresponding bits for the various fields of the data structure descriptor are also indicated in TABLE 2, although it will be appreciated that the length and position of fields in the data structure descriptor may vary. Also different descriptors may include more or fewer fields and different combinations of fields than those shown in the example of TABLE 2.

In the example of TABLE 2, the Data Structure Geometry field describes a geometry of the data structure. For example, the geometry of the sensor data structure may describe the type of data structure and the number of dimensions. One example type of sensor data structure is a coefficient list, which may be one-dimensional (e.g., indicating that the equation has a single variable). Also, some sensor data structures may be generic LIM, which may be one-dimensional or two-dimensional. In a two-dimensional data structure, such as a two-dimensional LUT, the equation represented has two variables. Also, a sensor data structure may be an equally-spaced LUT, which may also be one-dimensional or two-dimensional.

The Equation Type field indicates a type of equation that is described by the sensor data structure. Example equation types that may be described by the sensor data structure include, for example, a polynomial equation, a polynomial plus exponential equation, a quadratic equation, a Steinhart-Hart equation, a logarithmic equation, a bivariate polynomial equation, etc. The Direction field indicates the way that the sensor data structure is to be traversed to identify data elements for a given key value or key values. For example, the sensor data structure may be traversed forwards or backwards. The Sensor Type field indicate a type of sensor that is associated with the sensor data structure. The Data Type field indicates a data type of the data elements at the sensor data structure such as, for example, the number of bits used to represent the data elements. Examples include float (e.g., 32 bits), double (e.g., 64 bits), etc.

The Length field indicates the total length of the sensor data structure, for example, including the descriptor and data elements. The Length field may be used, for example, to traverse the sensor data stack. For example, when a particular data structures is needed, the processor circuit 110 may traverse the sensor data stack by reading the header for each sensor data structure and using the length indicated there to jump to the next sensor data structure. This may continue until the desired sensor data structure is found. An Error Detection Code field includes an error detection code, for example, describing for the data structure descriptor and/or data elements thereof. Any suitable error detection code format may be used such as, for example, CRC-16, CCITT.

Referring back to FIG. 9, at operation 910, the processor circuit 110 executes a sensor routine, for example, to sample raw sensor signals and provide measurement data to the host application, as described herein. At operation 912, the processor circuit 110 determines if values of any elements at the allocated sensor data structures are to be changed. If not, the processor circuit 110 continues to execute the sensor routine at operation 910. If a data element value at the sensor data structure is to be changed, the processor circuit overwrites an existing data element value with an updated value at operation 914. The changed value, in some examples, may fit within the same memory location or set of memory locations as the previous data element value and, according, reallocation may not be required. After writing the updated value at operation 914, the processor may continue to execute the sensor route at operation 910.

In some examples, some or all of the operations of the process flow 900 are executed outside of the measurement system. For example, the determination of data structures for a given configuration may be performed by the host application and/or in the development environment. Sensor data structures and, for example, a memory map describing memory locations for the sensor data structures may be provided by the host application to the measurement system along with the register map.

One type of equation that may be described by a sensor data structure is a monovariate or one-dimensional equation. An example sensor data structure showing equation coefficients for a monovariate equation is given by TABLE 3 below:

TABLE 3

| Number of coefficients (N) | Unit 32b |
|---|---|
| Range: min valid input value | Float 32b |

TABLE 3-continued

| Number of coefficients (N) | Unit 32b |
|---|---|
| Range: max valid input value | Float 32b |
| Coeff 0 | Float 64b |
| Coeff 1 | Float 64b |
| Coeff 2 | Float 64b |
| ... | |
| Coeff n-2 | Float 64b |
| Coeff n-1 | Float 64b |

In the example of TABLE 3, coefficients are identified by coefficient name. The first three records of TABLE 3 indicate the number of coefficients in the table, the minimum valid input (e.g., for the single variable) and the maximum valid input e.g., for the single variable). Data elements in the TABLE 3 include the coefficients as well as metadata such as the number of coefficients and the minimum and maximum valid input values.

One example of a monovariate or one-dimensional equation is a quadratic equation, which may describe some RTD sensors. An example form for a quadratic equation is given by Equation [1] below:

$$\frac{-C_0 + \sqrt{C_0^2 - 4C_1\left(1 - \frac{x}{C_2}\right)}}{2C_1} \quad [1]$$

Another example monovariate or one-dimensional equation is the Steinhart-Hart equation given by Equation [2] below, using degrees Kelvin as the unit of measure. The Steinhart-Hart equation is used to describe the behavior of some thermistor-type sensors.

$$T(°K) = (A + B \ln(x) + C[\ln(x)]^3)^{-1} \quad [2]$$

Another example monovariate or one-dimensional equation is a logarithmic equation, given by Equation [3] below, which may describe some thermistor sensor-types:

$$\left(\frac{\ln\left(\frac{x}{C_0}\right)}{C_2} + \frac{1}{C_1}\right) \quad [3]$$

Another type or equation that may be partially pre-calculated and described by a sensor data structure is a bivariate polynomial, which is two-dimensional. An example two-dimensional sensor data structure is given by TABLE 4 below:

TABLE 4

| Polynomial max degree: D | unsigned integer 32b |
|---|---|
| Range: min X input | float 32b |
| Range: max X input | float 32b |
| Range: min Y input | float 32b |
| Range: max Y input | float 32b |
| Constant term: $C_{0,0}$ | float 64b |
| Coeff. of $1^{st}$ degree monomial: $C_{0,1}$ | float 64b |
| Coeff. of $1^{st}$ degree monomial: $C_{1,0}$ | float 64b |

TABLE 4-continued

| Polynomial max degree: D | unsigned integer 32b |
|---|---|
| Coeff. of $2^{nd}$ degree monomial: $C_{0,2}$ | float 64b |
| Coeff. of $2^{nd}$ degree monomial: $C_{1,1}$ | float 64b |
| Coeff. of $2^{nd}$ degree monomial: $C_{2,0}$ | float 64b |
| Coeff. of $3^{rd}$ degree monomial: $C_{0,3}$ | float 64b |
| Coeff. of $3^{rd}$ degree monomial: $C_{1,2}$ | float 64b |
| Coeff.of $3^{rd}$ degree monomial: $C_{2,1}$ | float 64b |
| Coeff. of $3^{rd}$ degree monomial: $C_{3,0}$ | float 64b |
| ... | |
| Coeff of $D^{th}$ degree monomial: $C_{D-1,1}$ | float 64b |
| Coeff. of $D^{th}$ degree monomial: $C_{D,0}$ | float 64b |

In the example of TABLE 4, coefficients are identified by coefficient name. The first record of the table indicates the degree of the polynomial represented. The next four records indicate the minimum and maximum range of the two variables (here, X and Y). Additional records indicate a constant term and coefficients for the various degrees of the polynomial. An example representation of the polynomial is given by Equation [4] below:

$$\text{output} = \sum_{d=0}^{D} \sum_{k=0}^{d} C_{k,d-k} y^k x^{d-k} \quad [4]$$

Some sensor equations are represented in sensor data structures as LUTs. A LUT has one or two input variables that correspond to an output variable. If an input value falls between input variable values in the LUT, the output value may be interpolated at run-time from the adjacent LUT values, for example, in a linear way. As described herein, a LUT may have equally-spaced values or may not. An example "not-equally-spaced," one-dimensional LUT for an equation of the form Y=f(X) is given by TABLE 5 below:

TABLE 5

| Number of X = Number of Y = N |
|---|
| $X_0$ |
| $X_1$ |
| ... |
| $X_{N-3}$ |
| $A_{N-2}$ |
| $X_{N-1}$ |
| $Y_0$ |
| $Y_1$ |
| $Y_2$ |
| ... |
| $Y_{N-2}$ |
| $Y_{N-1}$ |

An example two-dimensional, "not-equally-spaced" LUT for an equation of the form Z=f(X,Y) is given by TABLE 6 below:

TABLE 6

| Num. of X: N | Num. of Y: M |
|---|---|
| $X_0$ | |
| $X_1$ | |
| ... | |
| $X_{N-1}$ | |
| $Y_0$ | |
| $Y_1$ | |
| ... | |
| $Y_{M-2}$ | |
| $Y_{M-1}$ | |
| $Z_{0,0}$ | |
| $Z_{1,0}$ | |
| ... | |
| $Z_{N-2,M-1}$ | |
| $Z_{N-1,M-1}$ | |

For suitable equations, an equally-spaced LUT may further simplify runtime processing and also reduce memory usage. TABLE 7 below shows one example of an equally-spaced LUT for a one-dimensional equation of the form Y=f(X):

TABLE 7

| Number of elements: N |
|---|
| $X_0$ |
| DX |
| $Y_0$ |
| $Y_1$ |
| $Y_2$ |
| ... |
| $Y_{N-2}$ |
| $Y_{N-1}$ |

In this example, $X_0$ is the initial input value, which may be the lowest input value. DX is the input value increment or the difference between values of X in the LUT. DX may be given by Equation [5] below:

$$DX = X_i - X_{i-1} \forall i \in [1, N-1] \quad [5]$$

During pre-calculation of the LUT of TABLE 7, the processor circuit 110 finds the inverse of DX, which is one over the input value increment.

Figure 10:
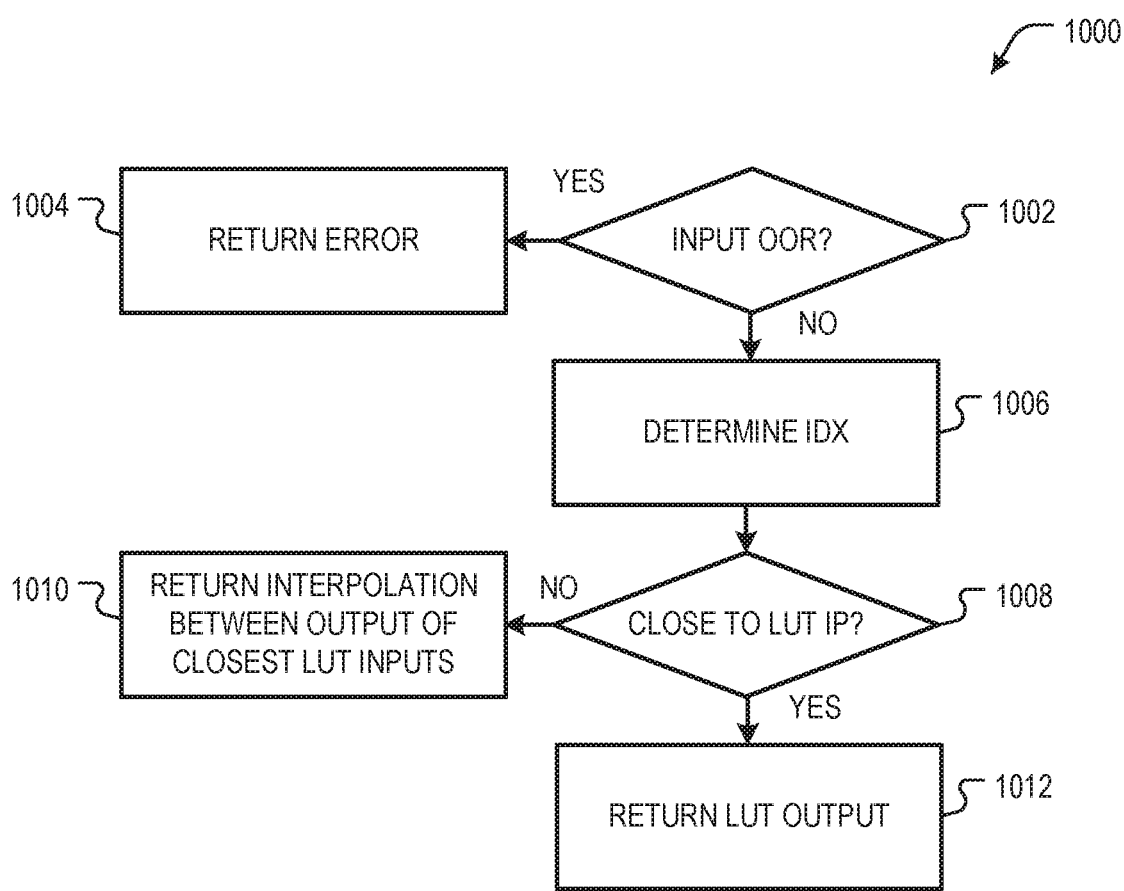
FIG. 10 is a flow chart showing one example of a process flow that may be executed by the measurement system at runtime to evaluate a single variable (e.g., one-dimensional) equation utilizing an equally-spaced LUT.

FIG. 10 is a flow chart showing one example of a process flow 1000 that may be executed by the processor circuit 110 at runtime to evaluate a single variable (e.g., one-dimensional) equation utilizing an equally-spaced LUT, such as the example LUT of TABLE 7. For example, equation evaluated utilizing the process flow 1000 may describe linearization of a raw sensor signal. The processor circuit 110 may begin with an input value x, which may represent a sample of the raw sensor signal and/or the output of a previous processing step. At operation 1002, the processor circuit 110 determines if the input value x is out of the range of the corresponding LUT and, if so, returns an error at operation 1004.

If the input x is in-range, the processor circuit 110 determines idx, where idx an index corresponding to the input x at operation 1006. For example, idx may be an offset from the initial input value $X_0$ that is normalized to the input value increment. For example, idx may be given by Equation [6] below:

$$idx = trunc\left((x - X_o) * \left(lut \to \frac{1}{dx}\right)\right) \quad [6]$$

Because 1/dx was calculated during pre-processing, the processor circuit's evaluation of Equation [6] at runtime may include multiplication and may exclude more computationally-expensive division. At operation 1008, the processor circuit 110 determines if idx is within a threshold value of a table input value (e.g., a $X_0$ plus an integer multiple of DX). If yes, the processor circuit 110 returns LUT value corresponding to the table input value at operation 1012. If not, the processor circuit 110 determines a linear interpolation between the LUT values corresponding to the two table input values closest to idx at operation 1010. An example equation for finding the interpolation is given by Equation [7] below:

$$\text{return} = (x - DX * idx) * (\text{output\_value}[idx+1] - \text{output\_value}[idx]) * \frac{1}{dx} + \text{output\_value}[idx] \quad [7]$$

TABLE 8 below shows an example of an equally-spaced LUT for a two-dimensional equation of the form Z=f(X, Y):

TABLE 8

| Num. of X: N | Num. of Y: M |
|---|---|
| $X_0$ | |
| DX | |
| $Y_0$ | |
| DY | |
| $Z_{0,0}$ | |
| $Z_{1,0}$ | |
| $Z_{2,0}$ | |
| ... | |
| $Z_{N-2,M-1}$ | |
| $Z_{N-1,M-1}$ | |

In this example, $X_0$ is the initial value for the first input X. $Y_0$ is the initial value for the second input Y. DX is the input value increment for the first input value X and DY is the input value increment for the second input value. DX and DY may be given by Equations [8] and [9] below, respectively:

$$DX = X_i - X_{i-1} \forall i \in [1, N-1] \quad [8]$$

$$DY = Y_i - Y_{i-1} \forall i \in [1, M-1] \quad [9]$$

During pre-processing, the processor circuit 110 may find the inverses of DX and DY, for example, similar to what was described with respect to the TABLE 7.

Figure 11:
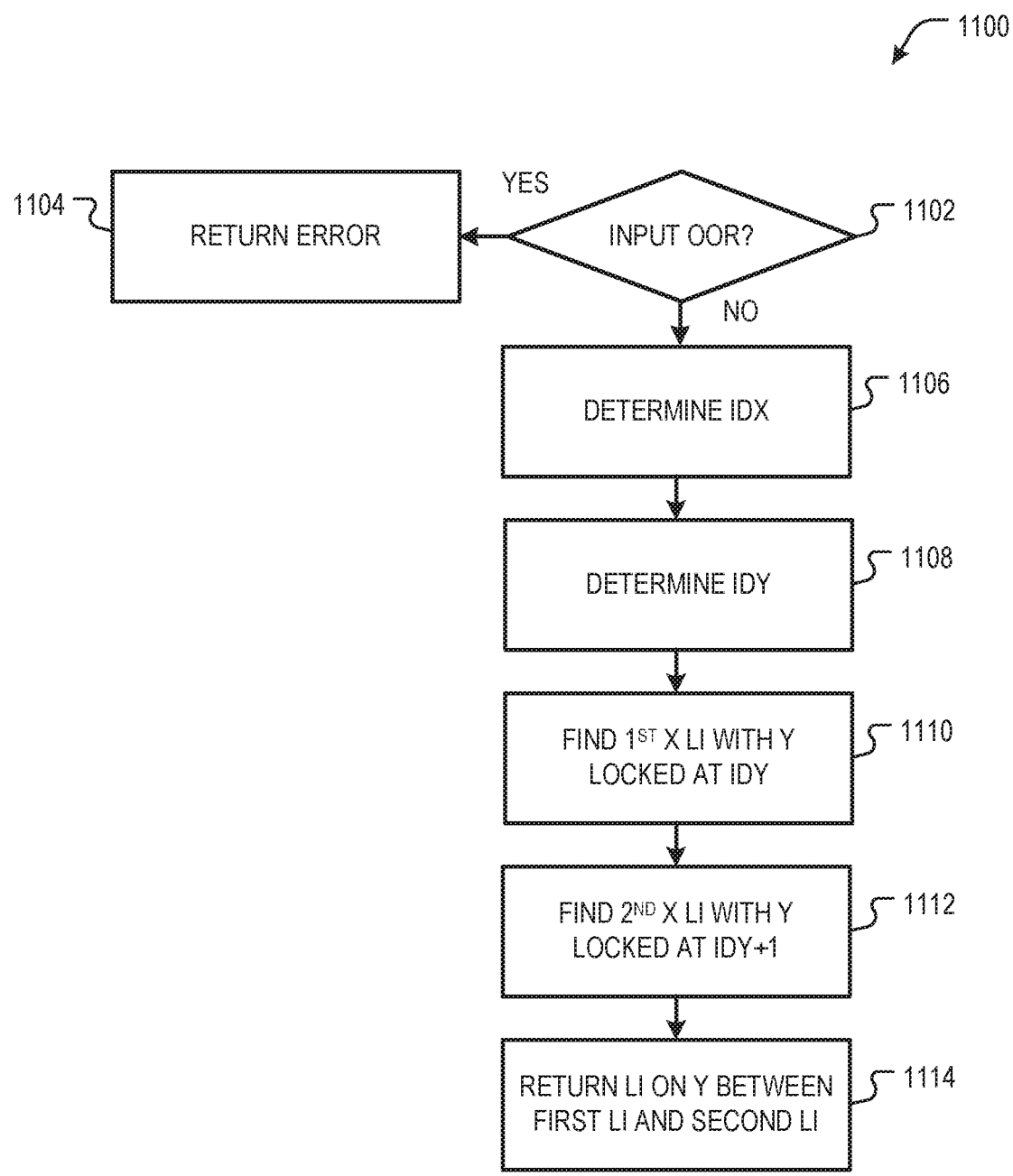
FIG. 11 is a flow chart showing one example of a process flow that may be executed by the measurement system at runtime to evaluate a two variable (e.g., two-dimensional) equation utilizing an equally-spaced LUT.

FIG. 11 is a flow chart showing one example of a process flow 1100 that may be executed by the processor circuit 110 at runtime to evaluate a two variable (e.g., two-dimensional) equation utilizing an equally-spaced LUT, such as the example LUT of TABLE 8. For example, equation evaluated utilizing the process flow 1100 may describe linearization of a raw sensor signal. The processor circuit 110 may begin with input values X and Y, which may represent samples of the raw sensor signal or signals from a sensor and/or the output of a previous processing step. At operation 1102, the processor circuit 110 determines if the input value x is in the range of the corresponding LUT and, if not, returns an error at operation 1104.

At operation 1106, the processor circuit 110 determines idx, where idx is an index corresponding to the input value x. For example, idx may be found according to Equation [6] above. At operation 1108, the processor circuit 110 determines idy, where idy is an index corresponding to the input value y. For example, idy may be found, for example, by substituting $Y_0$ and 1/DY into Equation [6].

At operation 1110, the processor circuit 110 finds a first X linear interpolation value from the LUT while keeping the second input Y locked at the second index idy. At operation 1112, the processor circuit 110 determines a second X linear interpolation value from the LUT while keeping the second input Y locked at the second index idy plus one. At operation 1114, the processor circuit 110 returns a linear interpolation on the second input Y between the first X linear interpolation and the second X linear interpolation. The result of operation 1114 may be returned.

EXAMPLES

In some example arrangements, a measurement system is for coupling a first sensor to a host device. The measurement system comprises an analog front end; a switch matrix; and a processor circuit. The processor circuit is configured to receive a first register map describing a first configuration of the measurement system for the first sensor. The processor circuit is also configured to configure the switch matrix to sample, via the analog front end, a first raw sensor signal from the first sensor according to the first configuration described by the first register map. The processor circuit is also configured to convert the first raw sensor signal to a first digital measurement data in a sensor unit for the first sensor. The processor circuit is also configured to send the first digital measurement data to the host device.

In some example arrangements, the processor circuit is also configured to, before configuring the switch matrix to sample the first raw sensor signal, determine that the first register map passes an error rule set indicating inconsistent register map arrangements.

In some example arrangements, the processor circuit is also configured to determine that a connectivity of the measurement system is consistent with the first sensor being connected to the measurement system.

In some example arrangements, the processor circuit is also configured to receive a second register map describing an alternative first configuration of the measurement system for the first sensor. The processor circuit may determine that a difference between the first configuration of the measurement system for the first sensor and the alternative first configuration of the measurement system for the first sensor is associated with recalibrating at least one component of the measurement system and prompt a recalibration of the at least one component of the measurement system.

In some example arrangements, the first register map also describes a second configuration of the measurement system for a second sensor. The processor circuit may also be configured to configure the switch matrix to sample, via the analog front end, a first raw sensor signal from the second sensor according to the second configuration. The processor circuit may also be configured to convert the first raw sensor signal from the second sensor to a second digital measurement data in a sensor unit for the second sensor and send the second digital measurement data to the host device.

In some example arrangements, the first register map also describes a measurement frequency for the first sensor and a measurement frequency for the second sensor. The processor circuit may be configured to determine a measurement sequence for the first sensor and the second sensor.

In some example arrangements, the host device is configured to compile a first configuration file to generate the first register map; compile a second configuration file to generate a second register map; and selectively send the first register map or the second register map to the measurement system based at least in part on a host application executing at the host device.

In some example arrangements, the first register map also describes a second configuration of the measurement system for a second sensor. The processor circuit may also be configured to generate a first sensor data structure describing a first equation for converting the first raw sensor signal to the first digital measurement data. The processor circuit may also allocate the first sensor data structure to a first set of memory addresses at a sensor data stack of the memory device. The processor circuit may also generate a second sensor data structure describing a second equation for converting a second raw sensor signal from the second sensor to a second digital measurement data and allocate the second sensor data structure to a second set of memory addresses at the sensor data stack. The first set of memory addresses may comprise more memory addresses than the second set of memory addresses.

In some example arrangements, the processor circuit is also configured to determine that a first value of the first sensor data structure is to change to a revised first value and overwrite the revised first value to at least one memory address associated with the first value.

Example 1 is a sensor management system, comprising: a host device comprising a host device processor circuit configured to perform operations comprising: receiving measurement system configuration data from a remote server, wherein the measurement system configuration data describes a first configuration of a measurement system for interfacing with a first sensor; generating a first register map based at least in part on the measurement system configuration data; and sending the first register map to the measurement system.

In Example 2, the subject matter of Example 1 optionally includes wherein the measurement system configuration data comprises first format configuration data describing the first configuration of the measurement system in a human-readable syntax and second format configuration data describing the first configuration of the measurement system in a computer-readable syntax.

In Example 3, the subject matter of any one or more of Examples 1-2 optionally includes the remote server, wherein the remote server is configured to perform operations comprising: receiving from a user an indication of a physical property to be measured; selecting the first sensor based on the indication of the physical property to be measured; and generating the measurement system configuration data based at least in part on the first sensor and the physical property to be measured.

In Example 4, the subject matter of any one or more of Examples 1-3 optionally includes wherein the measurement system is further configured to perform operations comprising determining that the first register map passes the error rule set.

In Example 5, the subject matter of any one or more of Examples 1-4 optionally includes wherein the measurement system is further configured to perform operations comprising: determining that a first bit value of the first register map is inconsistent with the first sensor; and deriving the first configuration of the measurement system from the first register map without considering the first bit value.

In Example 6, the subject matter of any one or more of Examples 1-5 optionally includes wherein the measurement system is further configured to perform operations comprising: determining that the first register map fails at least one error rule; and before configuring the switch matrix, receiving a user override code.

In Example 7, the subject matter of any one or more of Examples 1-6 optionally includes wherein the measurement system is further configured to perform operations comprising determining that a connectivity of the measurement system is consistent with the first sensor being connected to the measurement system.

In Example 8, the subject matter of any one or more of Examples 1-7 optionally includes wherein the measurement system is further configured to perform operations comprising: receiving a second register map describing an alternative first configuration of the measurement system for the first sensor; determining that a difference between the first configuration of the measurement system for the first sensor and the alternative first configuration of the measurement system for the first sensor is associated with recalibrating at least one component of the measurement system; and prompting a recalibration of the at least one component of the measurement system.

In Example 9, the subject matter of any one or more of Examples 1-8 optionally includes wherein the first register map also describes a second configuration of the measurement system for a second sensor, and wherein the measurement system is further configured to perform operations comprising: configuring the switch matrix to connect a second sensor, wherein an ADC samples a second raw sensor signal from the second sensor according to the second configuration; generating second digital measurement data based at least in part on the second raw sensor signal; and sending the second digital measurement data to the host device.

In Example 10, the subject matter of any one or more of Examples 1-9 optionally includes the host device, wherein the host device is configured to perform operations comprising: compiling a first configuration file to generate the first register map; compiling a second configuration file to generate a second register map; and selectively sending the first register map or the second register map to the measurement system based at least in part on a host application instruction from a host application executing at the host device.

Example 11 is a method for managing a sensor, comprising: receiving, from a host device, a first register map describing a first configuration of a measurement system, the first configuration associated with a first sensor; comparing the first register map to an error rule set indicating inconsistent register map arrangements; after comparing the first register map to the error rule set, configuring a switch matrix of the measurement system to sample the first sensor according to the first configuration of the measurement system; receiving a plurality of samples from a first sensor; and generating first digital measurement data based at least in part on the plurality of samples.

In Example 12, the subject matter of Example 11 optionally includes determining that the first register map passes the error rule set.

In Example 13, the subject matter of any one or more of Examples 11-12 optionally includes determining that a first bit value of the first register map is inconsistent with the first sensor; and deriving the first configuration of the measurement system from the first register map without considering the first bit value.

In Example 14, the subject matter of any one or more of Examples 11-13 optionally includes determining that the first register map fails at least one error rule; and before configuring the switch matrix, receiving a user override code.

In Example 15, the subject matter of any one or more of Examples 11-14 optionally includes determining that a connectivity of the measurement system is consistent with the first sensor being connected to the measurement system.

In Example 16, the subject matter of any one or more of Examples 11-15 optionally includes wherein the first digital measurement data comprises a first plurality of samples from the first sensor, further comprising: generating, with a processor circuit of the measurement system, a set of windowing coefficients for generating a fast Fourier transform (FFT); writing the set of windowing coefficients to a windowing coefficient buffer at a memory associated with the processor circuit; writing the first plurality of samples to a raw buffer at the memory; pre-processing the first plurality of samples to generate a set of pre-processed samples; writing the set of pre-processed samples to the raw buffer; determining a first FFT sample set based at least in part on the pre-processed samples; and writing the first FFT sample set to a first output buffer at the memory; reading the first FFT sample set from the first output buffer; and while reading the first FFT sample set from the first output buffer, writing a second FFT sample set based at least in part on a second plurality of samples from the first sensor to a second output buffer at the memory.

In Example 17, the subject matter of any one or more of Examples 11-16 optionally includes wherein the first register map also describes a second configuration of the measurement system for a second sensor, further comprising: generating, with a processor circuit of the measurement system, a first sensor data structure describing a first equation for converting a first raw sensor signal to the first digital measurement data; allocating the first sensor data structure to a first set of memory addresses at a sensor data stack of a memory associated with the processor circuit; generating a second sensor data structure describing a second equation for converting a second raw sensor signal from the second sensor to a second digital measurement data; and allocating the second sensor data structure to a second set of memory addresses at the sensor data stack, wherein the first set of memory addresses comprises more memory addresses than the second set of memory addresses.

In Example 18, the subject matter of Example 17 optionally includes wherein the processor circuit is also configured to perform operations comprising: determining that a first value of the first sensor data structure is to change to a revised first value; and overwriting the revised first value to at least one memory address associated with the first value.

Example 19 is a system for managing a sensor, comprising: means for receiving, from a host device, a first register map describing a first configuration of a measurement system, the first configuration associated with a first sensor; means for comparing the first register map to an error rule set indicating inconsistent register map arrangements; means for, after comparing the first register map to the error rule set, configuring a switch matrix of the measurement system to sample the first sensor according to the first configuration of the measurement system; means for receiving a plurality of samples from a first sensor; and means for generating first digital measurement data based at least in part on the plurality of samples.

In Example 20, the subject matter of Example 19 optionally includes means for determining that a first bit value of the first register map is inconsistent with the first sensor, and means for deriving the first configuration of the measurement system from the first register map without considering the first bit value.

Example 21 is a measurement system for coupling a first sensor to a host device, the measurement system comprising: an excitation circuit; a switch matrix; an analog-to-digital converter (ADC); and a processor circuit configured to perform operations comprising: receiving from the host device a first register map describing a first configuration of the measurement system for the first sensor, the first configuration indicating a first measurement frequency for the first sensor; configuring the switch matrix to provide a first excitation signal generated by the excitation circuit to the first sensor; configuring the switch matrix to connect the ADC to the first sensor, wherein the ADC samples a first raw sensor signal from the first sensor at a first measurement frequency described by the first configuration; generating first digital measurement data based at least in part on the first raw sensor signal; and sending the first digital measurement data to the host device.

In Example 22, the subject matter of Example 21 optionally includes wherein the first register map also describes a second measurement frequency for a second sensor, and wherein the processor circuit is further configured to perform operations comprising determining a measurement sequence for the first sensor and the second sensor based at least in part on the first measurement frequency and the second measurement frequency.

In Example 23, the subject matter of Example 22 optionally includes wherein the processor circuit is further configured to perform operations comprising generating a revised measurement sequence for the first sensor and the second sensor based at least in part on the first digital measurement data.

In Example 24, the subject matter of any one or more of Examples 22-23 optionally includes wherein the processor circuit is further configured to perform operations comprising: determining that the first digital measurement data is consistent with a first condition; determining a revised measurement frequency for the first sensor based at least in part on the first condition; and determining a revised measurement sequence for the second sensor based at least in part on the revised measurement frequency for the first sensor.

In Example 25, the subject matter of any one or more of Examples 22-24 optionally includes wherein the processor circuit is further configured to perform operations comprising: determining a first measurement cycle of the measurement sequence, wherein the first sensor and the second sensor are sampled in the first measurement cycle; and determining a second measurement cycle of the measurement sequence, wherein the first sensor is sampled in the first measurement cycle and the first sensor is not sampled in the second measurement cycle.

In Example 26, the subject matter of any one or more of Examples 21-25 optionally includes wherein the first register map also describes a second configuration of the measurement system for a second sensor, and wherein the processor circuit is further configured to perform operations comprising: configuring the switch matrix to connect the ADC to a second sensor, wherein the ADC samples a second raw sensor signal from the second sensor according to the second configuration; generating second digital measurement data based at least in part on the second raw sensor signal; and sending the second digital measurement data to the host device.

In Example 27, the subject matter of any one or more of Examples 21-26 optionally includes wherein the processor circuit is further configured to perform operations comprising: comparing that the first digital measurement data to previous digital measurement data sampled from the first sensor; and determining that a first ADC signature associated with the first digital measurement data is different than a previous ADC signature associated with the previous digital measurement data.

In Example 28, the subject matter of any one or more of Examples 21-27 optionally includes wherein the first digital measurement data comprises a first plurality of samples from the first sensor, and wherein the processor circuit is further configured to perform operations comprising: generating a set of windowing coefficients for generating a fast Fourier transform (FFT); writing the set of windowing coefficients to a windowing coefficient buffer at a memory associated with the processor circuit; writing the first plurality of samples to a raw buffer at the memory; pre-processing the first plurality of samples to generate a set of pre-processed samples; writing the set of pre-processed samples to the raw buffer; determining a first FFT sample set based at least in part on the pre-processed samples; and writing the first FFT sample set to a first output buffer at the memory; reading the first FFT sample set from the first output buffer; and while reading the first FFT sample set from the first output buffer, writing a second FFT sample set based at least in part on a second plurality of samples from the first sensor to a second output buffer at the memory.

In Example 29, the subject matter of any one or more of Examples 21-28 optionally includes wherein the first register map also describes a second configuration of the measurement system for a second sensor, and wherein the processor circuit is also configured to perform operations comprising: generating a first sensor data structure describing a first equation for converting the first raw sensor signal to the first digital measurement data; allocating the first sensor data structure to a first set of memory addresses at a sensor data stack of a memory associated with the processor circuit; generating a second sensor data structure describing a second equation for converting a second raw sensor signal from the second sensor to a second digital measurement data; and allocating the second sensor data structure to a second set of memory addresses at the sensor data stack, wherein the first set of memory addresses comprises more memory addresses than the second set of memory addresses.

In Example 30, the subject matter of any one or more of Examples 9-29 optionally includes wherein the processor circuit is also configured to perform operations comprising: determining that a first value of the first sensor data structure is to change to a revised first value; and overwriting the revised first value to at least one memory address associated with the first value.

Example 31 is a method for coupling a first sensor to a host device using a measurement system, comprising: receiving, by the measurement system and from the host device, a first register map describing a first configuration of the measurement system for the first sensor, the first configuration indicating a first measurement frequency for the first sensor; configuring a switch matrix of the measurement system to provide a first excitation signal to the first sensor; configuring the switch matrix to connect an analog-to-digital converter (ADC) of the measurement system to the first sensor; sampling a first raw sensor signal from the first sensor with the ADC at a first measurement frequency described by the first configuration; generating, by the measurement system, first digital measurement data based at least in part on the first raw sensor signal; and sending the first digital measurement data to the host device.

In Example 32, the subject matter of Example 31 optionally includes wherein the first register map also describes a second measurement frequency for a second sensor, and further comprising determining a measurement sequence for the first sensor and the second sensor based at least in part on the first measurement frequency and the second measurement frequency.

In Example 33, the subject matter of Example 32 optionally includes generating a revised measurement sequence for the first sensor and the second sensor based at least in part on the first digital measurement data.

In Example 34, the subject matter of any one or more of Examples 32-33 optionally includes determining that the first digital measurement data is consistent with a first condition; determining a revised measurement frequency for the first sensor based at least in part on the first condition; and determining a revised measurement sequence for the second sensor based at least in part on the revised measurement frequency for the first sensor.

In Example 35, the subject matter of any one or more of Examples 32-34 optionally includes determining a first measurement cycle of the measurement sequence, wherein the first sensor and the second sensor are sampled in the first measurement cycle; and determining a second measurement cycle of the measurement sequence, wherein the first sensor is sampled in the first measurement cycle and the first sensor is not sampled in the second measurement cycle.

Example 36 is a system for coupling a first sensor to a host device using a measurement system, comprising: means for receiving a first register map from the host device, the first register map describing a first configuration of the measurement system for the first sensor, the first configuration indicating a first measurement frequency for the first sensor; means for configuring a switch matrix of the measurement system to provide a first excitation signal to the first sensor; means for configuring the switch matrix to connect an analog-to-digital converter (ADC) of the measurement system to the first sensor; sampling a first raw sensor signal from the first sensor with the ADC at a first measurement frequency described by the first configuration; means for generating first digital measurement data based at least in part on the first raw sensor signal; and means for sending the first digital measurement data to the host device.

In Example 37, the subject matter of Example 36 optionally includes wherein the first register map also describes a second measurement frequency for a second sensor, and further comprising means for determining a measurement sequence for the first sensor and the second sensor based at least in part on the first measurement frequency and the second measurement frequency.

In Example 38, the subject flatter of Example 37 optionally includes means for generating a revised measurement sequence for the first sensor and the second sensor based at least in part on the first digital measurement data, In Example 39, the subject matter of any one or more of Examples 37-38 optionally includes means determining that the first digital measurement data is consistent with a first condition; means for determining a revised measurement frequency for the first sensor based at least in part on the first condition; and means for determining a revised measurement sequence for the second sensor based at least in part on the revised measurement frequency for the first sensor.

In Example 40, the subject matter of any one or more of Examples 37-39 optionally includes means for determining a first measurement cycle of the measurement sequence, wherein the first sensor and the second sensor are sampled in the first measurement cycle; and means for determining a second measurement cycle of the measurement sequence, wherein the first sensor is sampled in the first measurement cycle and the first sensor is not sampled in the second measurement cycle.

Figure 12:
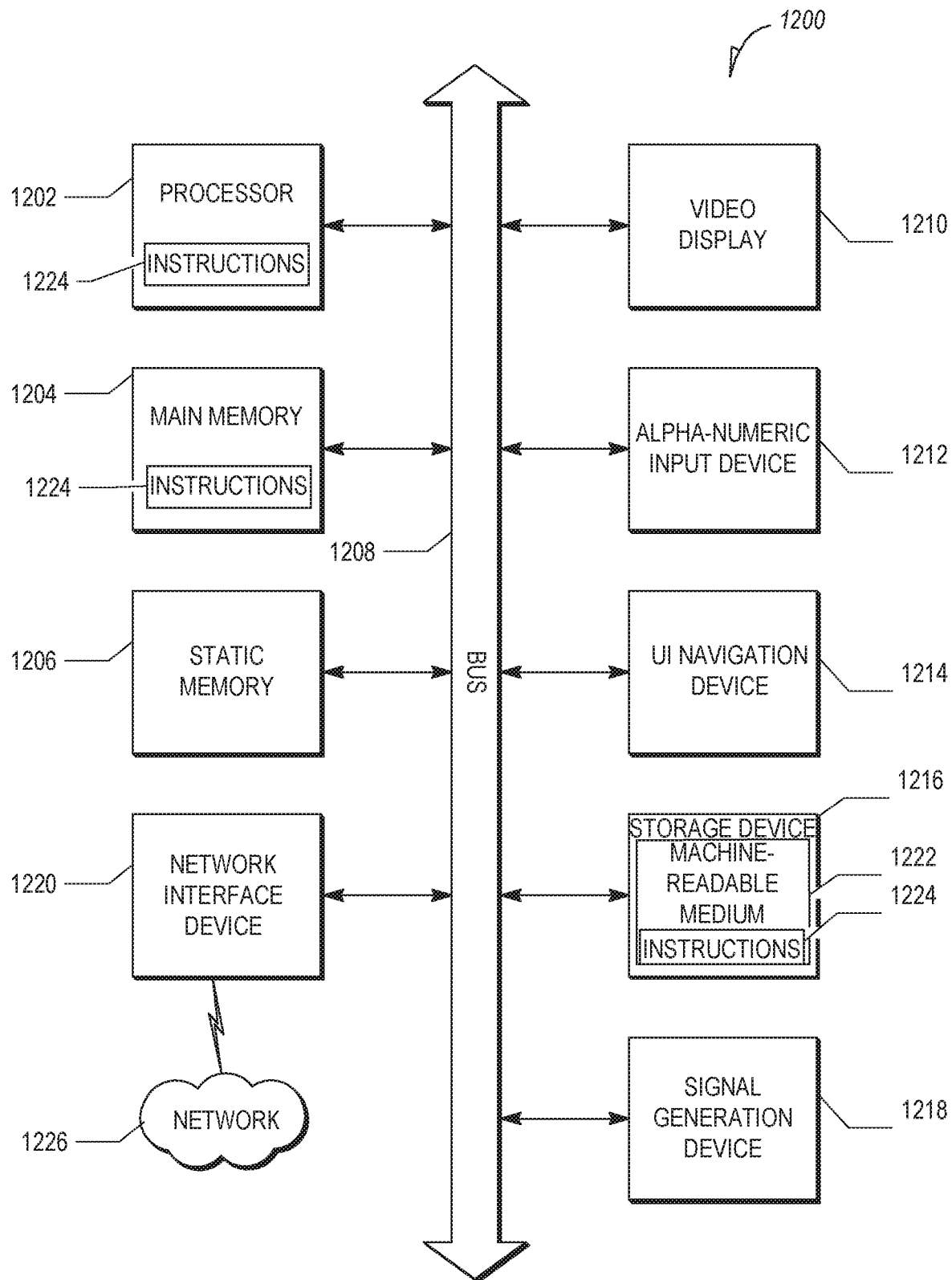
FIG. 12 is a block diagram illustrating a computing device hardware architecture, within which a set or sequence of instructions can be executed to cause a machine to perform examples of any one of the methodologies discussed herein.

FIG. 12 is a block diagram illustrating a computing device hardware architecture 1200, within which a set or sequence of instructions can be executed to cause a machine to perform examples of any one of the methodologies discussed herein. The architecture 1200 may describe, for example, any of the computing devices described herein. The architecture 1200 may operate as a standalone device or may be connected (e.g., networked) to other machines. In a networked deployment, the architecture 1200 may operate in the capacity of either a server or a client machine in server-client network environments, or it may act as a peer machine in peer-to-peer (or distributed) network environments. The architecture 1200 can be implemented in a personal computer (PC), a tablet PC, a hybrid tablet, a set-top box (STB), a personal digital assistant (PDA), a mobile telephone, a web appliance, a network router, a network switch, a network bridge, or any machine capable of executing instructions (sequential or otherwise) that specify operations to be taken by that machine.

The example architecture 1200 includes a processor unit 1202 comprising at least one processor (e.g., a central processing unit (CPU), a graphics processing unit (GPU), or both, processor cores, compute nodes, etc.). The architecture 120( )may further comprise a main memory 1204 and a static memory 1206, which communicate with each other via a link 1208 (e.g., bus). The architecture 1200 can further include a video display unit 1210, an alphanumeric input device 1212 (e.g., a keyboard), and a UI navigation device 1214 (e.g., a mouse). In some examples, the video display unit 1210, alphanumeric input device 1212, and UI navigation device 1214 are incorporated into a touchscreen display. The architecture 1200 may additionally include a storage device 1216 (e.g., a drive unit), a signal generation device 1218 (e.g., a speaker), a network interface device 1220, and one or more sensors (not shown), such as a GPS sensor, compass, accelerometer, or other sensor.

In some examples, the processor unit 1202 or another suitable hardware component may support a hardware interrupt, In response to a hardware interrupt, the processor unit 1202 may pause its processing and execute an ISR, for example, as described herein.

The storage device 1216 includes a machine-readable medium 1222 on which is stored one or more sets of data structures and instructions 1224 (e.g., software) embodying or utilized by any one or more of the methodologies or functions described herein. The instructions 1224 can also reside, completely or at least partially, within the main memory 1204, within the static memory 1206, and/or within the processor unit 1202 during execution thereof by the architecture 1200, with the main memory 1204, the static memory 1206, and the processor unit 1202 also constituting machine-readable media. The instructions 1224 stored at the machine-readable medium 1222 may include, for example, instructions for implementing the software architecture 1200, instructions for executing any of the features described herein, etc.

While the machine-readable medium 1222 is illustrated in an example to be a single medium, the term "machine-readable medium" can include a single medium or multiple media (e.g., a centralized or distributed database, and/or associated caches and servers) that store the one or more instructions 1224. The term "machine-readable medium" shall also be taken to include any tangible medium that is capable of storing, encoding, or carrying instructions for execution by the machine and that cause the machine to perform any one or more of the methodologies of the present disclosure, or that is capable of storing, encoding, or carrying data structures utilized by or associated with such TO instructions. The term "machine-readable medium" shall accordingly be taken to include, but not be limited to, solid-state memories, and optical and magnetic media. Specific examples of machine-readable media include non-volatile memory, including, but not limited to, by way of example, semiconductor memory devices (e.g., electrically programmable read-only memory (EPROM) and electrically erasable programmable read-only memory (EEPROM)) and flash memory devices; magnetic disks such as internal hard disks and removable disks; magneto-optical disks; and CD-ROM and DVD-ROM disks, The instructions 1224 can further be transmitted or received over a communications network 1226 using a transmission medium via the network interface device 1220 utilizing any one of a number of well-known transfer protocols (e.g., hypertext transfer protocol (HTTP)). Examples of communication networks include a LAN, a WAN, the Internet, mobile telephone networks, plain old telephone service (POTS) networks, and wireless data networks (e.g., 3G, and 5G LTE/LTE-A or WiMAX networks). The term "transmission medium" shall be taken to include any intangible medium that is capable of storing, encoding, or carrying instructions for execution by the machine, and includes digital or analog communications signals or other intangible media to facilitate communication of such software.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls. In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first,"

"second," and "third," etc. are used merely as labels, and are not intended to impose numerical requirements on their objects.

Geometric terms, such as "parallel", "perpendicular", "round", or "square", are not intended to require absolute mathematical precision, unless the context indicates otherwise. Instead, such geometric terms allow for variations due to manufacturing or equivalent functions. For example, if an element is described as "round" or "generally round," a component that is not precisely circular (e.g., one that is slightly oblong or is a many-sided polygon) is still encompassed by this description.

The term "circuit" can include a dedicated hardware circuit, a general-purpose microprocessor, digital signal processor, or other processor circuit, and may be structurally configured from a general purpose circuit to a specialized circuit such as using firmware or software.

Any one or more of the techniques (e.g., methodologies) discussed herein may be performed on a machine. In various embodiments, the machine may operate as a standalone device or may be connected (e.g., networked) to other machines. In a networked deployment, the machine may operate in the capacity of a server machine, a client machine, or both in server-client network environments, In an example, the machine may act as a peer machine in peer-to-peer (P2P) (or other distributed) network environment. The machine may be a personal computer (PC), a tablet PC, a set-top box (STB), a personal digital assistant (PDA), a mobile telephone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic or a number of components, or mechanisms. Circuit sets are a collection of circuits implemented in tangible entities that include hardware (e.g., simple circuits, gates, logic, etc.). Circuit set membership may be flexible over time and underlying hardware variability. Circuit sets include members that may, alone or in combination, perform specified operations when operating. In an example, hardware of the circuit set may be immutably designed to carry out a specific operation (e.g., hardwired). In an example, the hardware of the circuit set may include variably connected physical components (e.g., execution units, transistors, simple circuits, etc.) including a computer readable medium physically modified (e.g., magnetically, electrically, moveable placement of invariant massed particles, etc.) to encode instructions of the specific operation. in connecting the physical components, the underlying electrical properties of a hardware constituent are changed, for example, from an insulator to a conductor or vice versa. The instructions can enable embedded hardware (e.g., the execution units or a loading mechanism) to create members of the circuit set in hardware via the variable connections to carry out portions of the specific operation when in operation. Accordingly, the computer readable medium is communicatively coupled to the other components of the circuit set member when the device is operating. In an example, any of the physical components may be used in more than one member of more than one circuit set. For example, under operation, execution units may be used in a first circuit of a first circuit set at one point in time and reused by a second circuit in the first circuit set, or by a third circuit in a second circuit set at a different time.

Particular implementations of the systems and methods described herein may involve use of a machine (e.g., computer system) that may include a hardware processor (e.g., a central processing unit (CPU), a graphics processing unit (GPU), a hardware processor core, or any combination thereof), a main memory and a static memory, some or all of which may communicate with each other via an interlink (e.g., bus). The machine may further include a display unit, an alphanumeric input device (e.g., a keyboard), and a user interface (UI) navigation device (e.g., a mouse). In an example, the display unit, input device and UI navigation device may be a touch screen display. The machine may additionally include a storage device (e.g., drive unit), a signal generation device (e.g., a speaker), a network interface device, and one or more sensors, such as a global positioning system (GPS) sensor, compass, accelerometer, or other sensor. The machine may include an output controller, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device may include a machine readable medium on which is stored one or more sets of data structures or instructions (e.g., software) embodying or utilized by any one or more of the techniques or functions described herein. The instructions may also reside, completely or at least partially, within the main memory, within static memory, or within the hardware processor during execution thereof by the machine. In an example, one or any combination of the hardware processor, the main memory, the static memory, or the storage device may constitute machine readable media.

While the machine readable medium can include a single medium, the term "machine readable medium" may include a single medium or multiple media (e.g., a centralized or distributed database, and/or associated caches and servers) configured to store the one or more instructions.

The term "machine readable medium" may include any medium that is capable of storing, encoding, or carrying instructions for execution by the machine and that cause the machine to perform any one or more of the techniques of the present disclosure, or that is capable of storing, encoding or carrying data structures used by or associated with such instructions. Non-limiting machine readable medium examples may include solid-state memories, and optical and magnetic media. In an example, a massed machine readable medium comprises a machine readable medium with a plurality of particles having invariant (e.g., rest) mass. Accordingly, massed machine-readable media are not transitory propagating signals. Specific examples of massed machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions may further be transmitted or received over a communications network using a transmission medium via the network interface device utilizing any one of a number of transfer protocols (e.g., frame relay, internet protocol (IP), transmission control protocol (TCP), user datagram protocol (UDP), hypertext transfer protocol (HTTP), etc.), Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device may include one or more physical jacks (e.g., Ethernet, coaxial, or phone jacks) or one or more antennas to connect to the communications network. In an example, the network interface device may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine, and includes digital or analog communications signals or other intangible medium to facilitate communication of such software.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A measurement system for coupling a first sensor to a host device, the measurement system comprising:
an excitation circuit;
a switch matrix;
an analog-to-digital converter (ADC); and
a processor circuit configured to perform operations comprising:
receiving from the host device a first register map, the first register map indicating:
a first measurement frequency for the first sensor;
a first excitation signal parameter for the first sensor; and
at least one bit associated with a second sensor;
using the first register map, configuring the switch matrix to provide a first excitation signal generated by the excitation circuit to the first sensor, the configuring comprising arranging the switch matrix to provide an electrical connection between the excitation circuit and an excitation output pin of the measurement system in accordance with the first excitation signal parameter;
configuring the switch matrix to connect the ADC to the first sensor, wherein the ADC samples a first raw sensor signal from the first sensor at the first measurement frequency indicated by the first register map;
configuring the switch matrix to connect the ADC to the second sensor, wherein the ADC samples a second raw sensor signal from the second sensor;
generating first digital measurement data based at least in part on the first raw sensor signal;
generating second digital measurement data based at least in part on the second raw sensor signal; and
sending the first digital measurement data and the second digital measurement data to the host device.

2. The measurement system of claim 1, wherein the first register map also describes a second measurement frequency for the second sensor, and wherein the processor circuit is further configured to perform operations comprising determining a measurement sequence for the first sensor and the second sensor based at least in part on the first measurement frequency and the second measurement frequency.

3. The measurement system of claim 2, wherein the processor circuit is further configured to perform operations comprising generating a revised measurement sequence for the first sensor and the second sensor based at least in part on the first digital measurement data.

4. The measurement system of claim 2, wherein the processor circuit is further configured to perform operations comprising:
determining a revised measurement frequency for the first sensor based at least in part on the first digital measurement; and
determining a revised measurement sequence for the second sensor based at least in part on the revised measurement frequency for the first sensor.

5. The measurement system of claim 2, wherein the processor circuit is further configured to perform operations comprising:
determining a first measurement cycle of the measurement sequence, wherein the first sensor and the second sensor are sampled in the first measurement cycle; and
determining a second measurement cycle of the measurement sequence, wherein the first sensor is sampled in the first measurement cycle and the first sensor is not sampled in the second measurement cycle.

6. The measurement system of claim 1, wherein the first digital measurement data comprises a first plurality of samples from the first sensor, and wherein the processor circuit is further configured to perform operations comprising:

generating a set of windowing coefficients for generating a fast Fourier transform (FFT);

writing the set of windowing coefficients to a windowing coefficient buffer at a memory associated with the processor circuit;

writing the first plurality of samples to a raw buffer at the memory;

pre-processing the first plurality of samples to generate a set of pre-processed samples;

writing the set of pre-processed samples to the raw buffer;

determining a first FFT sample set based at least in part on the pre-processed samples; and writing the first FFT sample set to a first output buffer at the memory;

reading the first FFT sample set from the first output buffer; and while reading the first FFT sample set from the first output buffer, writing a second FFT sample set based at least in part on a second plurality of samples from the first sensor to a second output buffer at the memory.

7. The measurement system of claim 1, wherein the processor circuit is also configured to perform operations comprising:

generating a first sensor data structure describing a first equation for converting the first raw sensor signal to the first digital measurement data;

allocating the first sensor data structure to a first set of memory addresses at a sensor data stack of a memory associated with the processor circuit;

generating a second sensor data structure describing a second equation for converting a second raw sensor signal from the second sensor to a second digital measurement data; and allocating the second sensor data structure to a second set of memory addresses at the sensor data stack, wherein the first set of memory addresses comprises more memory addresses than the second set of memory addresses.

8. The measurement system of claim 7, wherein the processor circuit is also configured to perform operations comprising:

determining that a first value of the first sensor data structure is to change to a revised first value: and overwriting the revised first value to at least one memory address associated with the first value.

9. A method for coupling a first sensor to a host device using a measurement system, comprising:

receiving, by the measurement system and from the host device, a first register map, the first register map indicating:

a first measurement frequency for the first sensor;

a first excitation signal parameter for the first sensor; and at least one bit associated with a second sensor using the first register map, configuring a switch matrix of the measurement system to provide a first excitation signal to the first sensor, the configuring comprising arranging the switch matrix to provide an electrical connection between an excitation circuit of the measurement system and an excitation output pin of the measurement system in accordance with the first excitation signal parameter;

configuring the switch matrix to connect an analog-to-digital converter (ADC) of the measurement system to the first sensor;

configuring the switch matrix to connect the ADC to the second sensor, wherein the ADC samples a second raw sensor signal from the second sensor:

sampling a first raw sensor signal from the first sensor with the ADC at the first measurement frequency indicated by the first register map;

generating, by the measurement system, first digital measurement data based at least in part on the first raw sensor signal;

generating second digital measurement data based at least in part on the second raw sensor signal; and sending the first digital measurement data and the second digital measurement data to the host device.

10. The method of claim 9, wherein the first register map also describes a second measurement frequency for a second sensor, and further comprising determining a measurement sequence for the first sensor and the second sensor based at least in part on the first measurement frequency and the second measurement frequency.

11. The method of claim 10, further comprising generating a revised measurement sequence for the first sensor and the second sensor based at least in part on the first digital measurement data.

12. The method of claim 10, further comprising:

determining a revised measurement frequency for the first sensor based at least in part on the first digital measurement; and determining a revised measurement sequence for the second sensor based at least in part on the revised measurement frequency for the first sensor.

13. The method of claim 10, further comprising:

determining a first measurement cycle of the measurement sequence, wherein the first sensor and the second sensor are sampled in the first measurement cycle; and determining a second measurement cycle of the measurement sequence, wherein the first sensor is sampled in the first measurement cycle and the first sensor is not sampled in the second measurement cycle.

14. A system for coupling a first sensor to a host device using a measurement system, comprising:

means for receiving a first register map from the host device, the first register map indicating:

a first measurement frequency for the first sensor;

a first excitation signal parameter for the first sensor; and at least one bit associated with a second sensor;

means for using the first register map to configure a switch matrix of the measurement system to provide a first excitation signal to the first sensor, the configuring comprising arranging the switch matrix to provide an electrical connection between an excitation circuit and an excitation output pin of the measurement system in accordance with the first excitation signal parameter;

means for configuring the switch matrix to connect an analog-to-digital converter (ADC) of the measurement system to the first sensor to sample a first raw sensor signal from the first sensor at the first measurement frequency indicated by the first register map;

means for configuring the switch matrix to connect the ADC to the second sensor, wherein the ADC samples a second raw sensor signal from the second sensor;

means for generating first digital measurement data based at least in part on the first raw sensor signal;

means for generating second digital measurement data based at least in part on the second raw sensor signal; and means for sending the first digital measurement data and the second digital measurement data to the host device.

15. The system of claim 14, wherein the first register map also describes a second measurement frequency for the second sensor, and further comprising means for determining a measurement sequence for the first sensor and the second sensor based at least in part on the first measurement frequency and the second measurement frequency.

16. The system of claim 15, further comprising means for generating a revised measurement sequence for the first sensor and the second sensor based at least in part on the first digital measurement data.

17. The system of claim 15, further comprising:

means for determining a revised measurement frequency for the first sensor based at least in part on the first digital measurement; and means for determining a revised measurement sequence for the second sensor based at least in part on the revised measurement frequency for the first sensor.

18. The system of claim 15, further comprising:

means for determining a first measurement cycle of the measurement sequence, wherein the first sensor and the second sensor are sampled in the first measurement cycle; and means for determining a second measurement cycle of the measurement sequence, wherein the first sensor is sampled in the first measurement cycle and the first sensor is not sampled in the second measurement cycle.

* * * * *